(12) United States Patent
Cartamil Bueno

(10) Patent No.: US 12,287,476 B2
(45) Date of Patent: Apr. 29, 2025

(54) OPTICAL ELEMENT HAVING A MOVABLE REFLECTIVE COVER COMPRISING A 2-DIMENSIONAL MATERIAL

(71) Applicant: Santiago Jose Cartamil Bueno, Cologne (DE)

(72) Inventor: Santiago Jose Cartamil Bueno, Cologne (DE)

(*) Notice: Subject to any disclaimer, the term of this patent is extended or adjusted under 35 U.S.C. 154(b) by 428 days.

(21) Appl. No.: 17/630,078

(22) PCT Filed: Aug. 18, 2020

(86) PCT No.: PCT/EP2020/073125
§ 371 (c)(1),
(2) Date: Jan. 25, 2022

(87) PCT Pub. No.: WO2021/032752
PCT Pub. Date: Feb. 25, 2021

(65) Prior Publication Data
US 2022/0214535 A1    Jul. 7, 2022

(30) Foreign Application Priority Data
Aug. 19, 2019 (EP) .................................. 19192382

(51) Int. Cl.
*G02B 26/08* (2006.01)
*G02B 26/00* (2006.01)
(Continued)

(52) U.S. Cl.
CPC ....... *G02B 26/001* (2013.01); *G02B 26/0825* (2013.01); *G02B 27/0172* (2013.01);
(Continued)

(58) Field of Classification Search
CPC .............. G02B 26/001; G02B 26/0825; G02B 27/0172; G02B 2027/0178; G02B 26/00;
(Continued)

(56) References Cited

U.S. PATENT DOCUMENTS

| 2012/0044570 A1* | 2/2012 | Kitahara | G02B 5/28 359/589 |
| 2014/0332077 A1 | 11/2014 | Crouse | |
| 2015/0253564 A1* | 9/2015 | Shinto | G02B 26/001 359/578 |

FOREIGN PATENT DOCUMENTS

| CN | 103229248 A | 7/2013 |
| CN | 106199796 A | 12/2016 |

(Continued)

OTHER PUBLICATIONS

International Search Report and Written Opinion for the International Patent Application No. PCT/EP2020/073125, mailed Nov. 24, 2020, 10 pages.
(Continued)

*Primary Examiner* — Euncha P Cherry
(74) *Attorney, Agent, or Firm* — KDW Firm PLLC

(57) ABSTRACT

An optical element having a cover comprising a 2-dimensional material. The optical element includes a cover having a first surface and a second surface, a support, and a means, where the cover is orientated with the first surface directed towards the support, a part of the first surface is attached to the support, a spatial arrangement of the second surface relative to the support defines a cover contour profile, the means is adapted and arranged to move the second surface from a first cover contour profile to a further cover contour profile, the cover comprises a 2-dimensional portion which is one or more 2-dimensional materials, the cover has a value of transmittance divided by reflectance of not more than 0.5, for light incident on the second surface, the reflectance and transmittance being measured at a wavelength λ, and λ is in the range from 10 nm to 20 μm.

16 Claims, 12 Drawing Sheets

Figure 1:
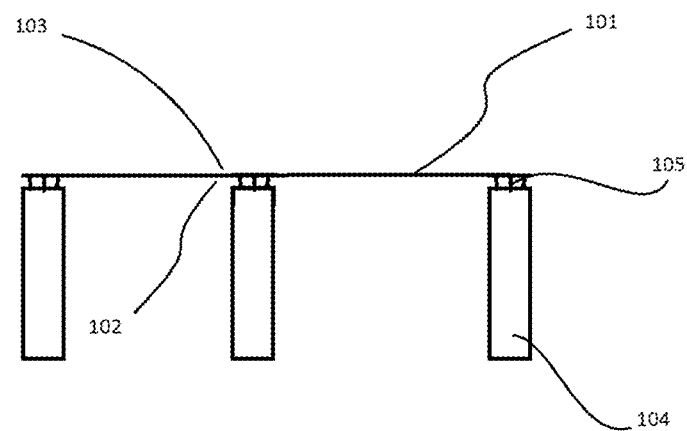

(51) Int. Cl.
*G02B 27/01* (2006.01)
*C23C 16/26* (2006.01)
*C23C 16/34* (2006.01)

(52) U.S. Cl.
CPC ............ *C23C 16/26* (2013.01); *C23C 16/342* (2013.01); *G02B 2027/0178* (2013.01)

(58) Field of Classification Search
CPC ..... C23C 16/26; C23C 16/342; C23C 28/322; C23C 28/34; C23C 28/345; C03C 17/3464
See application file for complete search history.

(56) References Cited

FOREIGN PATENT DOCUMENTS

| | | |
|---|---|---|
| CN | 206741128 | 12/2017 |
| JP | 2008282465 A | 11/2008 |
| WO | 2018228671 A1 | 12/2018 |

OTHER PUBLICATIONS

Khan, Zulfiqar Hasan et al. "Mechanical and electromechanical properties of graphene and their potential application in MEMS." Journal of Physics D 50 (2017): 053003.

* cited by examiner 801  802  803  804

OPTICAL ELEMENT HAVING A MOVABLE REFLECTIVE COVER COMPRISING A 2-DIMENSIONAL MATERIAL

This application is a national stage filing under 35 U.S.C. 371 of pending International Application No. PCT/EP2020/073125, filed Aug. 18, 2020, which claims priority to European patent application serial number 19192382.0, filed Aug. 19, 2019, the entirety of which applications are incorporated by reference herein.

FIELD OF THE INVENTION

The invention relates in general to an optical element having a cover comprising a 2-dimensional material. In particular, the invention relates to an optical element, a process for making an optical element, a device, a use of a coated 2-dimensional material, a use of an optical element and a use of a device.

BACKGROUND

Adjustable optical devices are useful for a number of light scattering, light reflection and light interference applications. Particular utility is provided by devices which are adjustable on a unit-by-unit basis, in particular miniature devices in which the elements are small, such as a display device having multiple pixels. One category of devices allow manipulation of images. In such devices, control of scattering, reflection and/or interference behaviour can be used to turn a pixel on or off and/or vary its colour. Another application is in light sails, where dynamics are dependent on the shape which a sail presents to a light flux.

One recent attempt at improving an optical device has been made in International patent application WO/2018/228671 A1, where a monolayer is employed in an interferometric device.

There remains a requirement to improve adjustable optical devices, in particular devices having miniaturised controllable pixels.

SUMMARY OF THE INVENTION

It is a general object of this invention to overcome, at least partially, one or more deficiencies inherent to the state of the art, in particular in relation to adjustable optical devices.

It is an object to provide an optical element having adjustable light scattering behaviour, preferably adjustable on a unit-by-unit basis.

It is an object to provide an optical element which can be moved between a specular reflector and a diffuse reflector, preferably adjustable on a unit-by-unit basis.

It is an object to provide an optical element having adjustable light interference behaviour, preferably adjustable on a unit-by-unit basis.

It is an object to provide an optical element which can be adjusted with an increased operational frequency.

It is an object to provide an optical element, preferably an adjustable optical element, having a reduced mass.

It is an object to provide an optical element having an increased mechanical strength.

It is an object to provide an optical element having a reduced power consumption.

It is an object to provide an optical element having an increased durability.

It is an object to provide an optical element having increased thermal stability.

It is an object to provide an optical element having increased thermal conductance.

It is an object to provide an optical element having increased dynamic range.

It is an object to provide an optical element having improved wavelength control and increased continuous tuneability.

It is an object to provide an optical element having improved angle control and increased continuous tuneability.

It is an object to provide an optical element having increased effect homogeneity.

It is an object to provide an optical element having increased reflectance.

It is an object to provide an optical element having reduced manufacturing complexity.

It is an object to provide an optical element having increased dynamic range.

It is an object to provide an optical element having increased data transmission bandwidth.

It is an object to provide an optical element, preferably a light sail, which experiences an increased thrust from incident light.

DETAILED DESCRIPTION

A contribution to solving, at least partially, one or more of the deficiencies of the state of the art is made by the following embodiments, with embodiment number x indicated as [x]. Dependent embodiments represent preferred arrangements of the independent embodiments.

[1] An optical element comprising:
a. a cover having a first surface and a second surface,
b. a support, and
c. a means;
wherein:
the cover is orientated with the first surface directed towards the support;
a part of the first surface is attached to the support, the part preferably not being more than 60 area % of the first surface, more preferably not more than 20 area % of the first surface, most preferably not more than 5 area % of the first surface;
A spatial arrangement of the second surface relative to the support defines a cover contour profile;
the means is adapted and arranged to move the second surface from a first cover contour profile to a further cover contour profile;
the cover comprises a 2-dimensional portion which is one or more 2-dimensional materials;
the cover has a value of transmittance divided by reflectance of not more than 0.5, preferably not more than 0.25, more preferably not more than 0.1, most preferably not more than 0.01, for light incident on the second surface, the reflectance and transmittance being measured at a wavelength $\lambda$; and
$\lambda$ is in the range from 10 nm to 20 µm, preferably 10 nm to 2 µm. In one aspect, most preferably 380 to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, the first cover contour profile is a rest position. A preferred rest position has the means in a deactivated state. In one aspect, the means is adapted and arranged to apply a maximum potential difference $V_{max}$ and the means does not apply a potential difference of more than $V_{max}/5$ in the rest position, preferably not more than $V_{max}/10$, more preferably not more than $V_{max}/20$. The means preferably applies no potential difference in the rest position.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the cover and support border one or more open cavities. The one or more open cavities preferably each have an opening, the opening and the cover being on opposite sides of the cavity.

In one aspect of this embodiment, the reflectance and transmittance are for light incident on the second surface. In one aspect of this embodiment, the transmittance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[2] The optical element according to embodiment [1], wherein movement from the first cover contour profile to the second cover contour profile alters the orientation of the second surface with respect to the support in at least one place on the second surface.

In one embodiment, movement from the first cover contour profile to the second cover contour profile alters an altitude of a point on the cover, the altitude being defined with reference to a plane of the support. In one aspect of this embodiment, the plane of the support is defined by the points of attachment between the cover and the support. In another aspect, the plane of the support is a face of the support. In another aspect, the plane of the support is a partial face of the support. In one aspect of this embodiment, the movement alters the altitude of multiple points on the cover, preferably at least 10% by area of the cover, more preferably at least 50% by area of the cover, more preferably at least 80% by area of the cover.

[3] The optical element according to any of the preceding embodiments, wherein the cover comprises an amorphous portion which is one or more amorphous materials. In one aspect of this embodiment, the amorphous portion comprises one or more metals, preferably is one or more metals. In one aspect of this embodiment, the amorphous portion comprises one or more additives, preferably is one or more additives. In one aspect of this embodiment, the amorphous portion is not a 2-dimensional material. In one aspect of this embodiment, the amorphous portion does not contain a 2-dimensional material. In one aspect of this embodiment, the amorphous portion is not a 2-dimensional material.

[4] The optical element according to embodiment [3], wherein the mean density of the amorphous portion in the cover is 24 $kg/m^2$ or less, preferably $2.4 \cdot 10^{-1}$ $kg/m^2$ or less, more preferably $2.4 \cdot 10^{-2}$ $kg/m^2$ or less, more preferably $2.4 \cdot 10^{-3}$ $kg/m^2$ or less, most preferably $1.2 \cdot 10^{-3}$ $kg/m^2$ or less.

[5] The optical element according to embodiment [3] or [4], wherein the mean density of the amorphous portion in the cover is $1.7 \cdot 10^{-9}$ $kg/m^2$ or more, preferably $3.4 \cdot 10^{-8}$ $kg/m^2$ or more, more preferably $1.8 \cdot 10^{-7}$ $kg/m^2$ or more. In one aspect of this embodiment, the mean density is $5 \cdot 10^{-7}$ $kg/m^2$ or more, preferably $1.5 \cdot 10^{-6}$ $kg/m^2$ or more, more preferably $5.4 \cdot 10^{-6}$ $kg/m^2$ or more, more preferably $5.7 \cdot 10^{-5}$ $kg/m^2$ or more.

[6] The optical element according to any of the embodiments [3] to [5], wherein the amorphous portion is present as an amorphous containing layer, the 2-dimensional portion preferably being present outside the amorphous containing layer. In one aspect of this embodiment, the cover comprises a 2-dimensional containing layer which is closer to the support than the amorphous containing layer. In one aspect of this embodiment, the cover comprises a 2-dimensional containing layer which is further from the support than the amorphous containing layer.

[7] The optical element according to embodiment [6], wherein the amorphous containing layer has a mean density of 24 $kg/m^2$ or less, preferably $2.4 \cdot 10^{-1}$ $kg/m^2$ or less, more preferably $2.4 \cdot 10^{-2}$ $kg/m^2$ or less, more preferably $2.4 \cdot 10^{-3}$ $kg/m^2$ or less, most preferably $1.2 \cdot 10^{-3}$ $kg/m^2$ or less.

[8] The optical element according to embodiment [6] or [7], wherein the amorphous containing layer has a mean density of $1.7 \cdot 10^{-9}$ $kg/m^2$ or more, preferably $3.4 \cdot 10^{-8}$ $kg/m^2$ or more, more preferably $1.8 \cdot 10^{-7}$ $kg/m^2$ or more. In one aspect of this embodiment, the mean density is $5 \cdot 10^{-7}$ $kg/m^2$ or more, preferably $1.5 \cdot 10^{-6}$ $kg/m^2$ or more, more preferably $5.4 \cdot 10^{-6}$ $kg/m^2$ or more, more preferably $5.7 \cdot 10^{-5}$ $kg/m^2$ or more.

[9] The optical element according to any of the embodiments [6] to [8], wherein the amorphous containing layer has a thickness of 1 mm or less, preferably 10 μm or less, more preferably 1000 nm or less, more preferably 100 nm or less, more preferably 50 nm or less.

[10] The optical element according to any of the embodiments [6] to [9], wherein the amorphous containing layer has a thickness of 25 µm or more, preferably 69 pm or more, more preferably 100 µm or more. In one aspect of this embodiment, the thickness is 1 nm or more, preferably 3 nm or more. In another aspect of this embodiment, the thickness is 5 nm or more, preferably 10 nm or more, more preferably 30 nm or more.

[11] The optical element according to any of the embodiments [6] to [10], wherein the amorphous containing layer has an electrical resistivity of less than $10^6$ Ω·cm, preferably less than $10^{-1}$ Ω·cm, more preferably less than $10^{-3}$ Ω·cm, most preferably less than $10^{-5}$ Ω·cm. The electrical resistivity might be as low as $10^{-8}$ Ω·cm, in particular where a non-super conductive conductor is employed. The electrical resistivity might be lower than $10^{-8}$ Ω·cm, in particular where a super conductive material is employed.

[12] The optical element according to any of the embodiments [6] to [11], wherein the amorphous containing layer is at a surface of the cover. In one aspect of this embodiment, the amorphous containing layer is at the first surface of the cover. In another aspect of this embodiment, the amorphous containing layer is at the second surface of the cover. In another aspect of this embodiment, an amorphous containing layer is present at both the first surface and the second surface of the cover. In another aspect of this embodiment, an amorphous containing layer is present at neither the first surface nor the second surface of the cover.

[13] The optical element according to any of the embodiments [6] to [12], wherein the amorphous containing layer has a value of transmittance divided by reflectance of not more than 0.5, preferably not more than 0.25, more preferably not more than 0.1, most preferably not more than 0.01, the reflectance and transmittance being measured at a wavelength $\lambda$;

wherein $\lambda$ is in the range 10 nm to 20 µm, preferably 10 nm to 2 µm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, $\lambda$ is 532 nm. It is preferred according to this aspect for optical measurements to be made using a frequency doubled Nd YAG laser.

In one aspect of this embodiment, $\lambda$ is 476 nm. It is preferred according to this aspect for optical measurements to be made using a blue Kr laser.

In one aspect of this embodiment, $\lambda$ is 594 nm. It is preferred according to this aspect for optical measurements to be made using a yellow He—Ne laser.

In one aspect of this embodiment, $\lambda$ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths $\lambda$ in the range from 10 nm to 2 µm, preferably for all wavelengths in the range from 10 nm to 20 µm.

In one aspect of this embodiment, the value of transmittance divided by reflectance is 0.5 or less, preferably 0.25 or less, more preferably 0.1 or less, most preferably 0.01 for all wavelengths $\lambda$ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths $\lambda$ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths $\lambda$ in the range from 850 to 1550 nm, preferably for all wavelengths in the range from 700 to 2000 nm.

In one aspect of this embodiment, the reflectance and transmittance are for light incident on the second surface. In one aspect of this embodiment, the transmittance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[14] The optical element according to any of the embodiments [6] to [13], wherein the amorphous containing layer has a value of absorbance divided by reflectance of not more than 0.5, preferably not more than 0.25, more preferably not more than 0.1, most preferably not more than 0.01, the reflectance and absorbance being measured at a wavelength $\lambda$;

wherein $\lambda$ is in the range from 10 nm to 20 µm, preferably 10 nm to 2 µm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, $\lambda$ is 532 nm. It is preferred according to this aspect for optical measurements to be made using a frequency doubled Nd YAG laser.

In one aspect of this embodiment, $\lambda$ is 476 nm. It is preferred according to this aspect for optical measurements to be made using a blue Kr laser.

In one aspect of this embodiment, $\lambda$ is 594 nm. It is preferred according to this aspect for optical measurements to be made using a yellow He—Ne laser.

In one aspect of this embodiment, $\lambda$ is 647 nm. It is preferred according to this aspect for optical measurements to be made using a red Kr laser.

In one aspect of this embodiment, the value of absorbance divided by reflectance is 0.5 or less, preferably 0.25 or less, more preferably 0.1 or less, most preferably 0.01 for all wavelengths $\lambda$ in the range from 10 nm to 2 µm, preferably for all wavelengths in the range from 10 nm to 20 µm.

In one aspect of this embodiment, the value of absorbance divided by reflectance is 0.5 or less, preferably 0.25 or less, more preferably 0.1 or less, most preferably 0.01 for all wavelengths $\lambda$ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths $\lambda$ in the range from 13 to 193 nm, preferably for all wavelengths in the range from 10 to 200 nm. In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the absorbance and reflectance are for light incident on the second surface. In one aspect of this embodiment, the absorbance and reflectance values are for light incident at an angle θ from a normal to the second surface, θ being in the range from 0 to 85°. In one aspect, θ is 0°. In another aspect θ is 15°. In another aspect, θ is 30°. In another aspect θ is 45°. In another aspect θ is 60°. In another aspect θ is 75°.

In one aspect of this embodiment, the absorbance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

[15] The optical element according to any of the preceding embodiments, wherein the cover comprises a metal portion which is one or more metals. In one aspect of this embodiment, the metal portion comprises one or more amorphous materials, preferably is one or more amorphous materials. In one aspect of this embodiment, the metal portion comprises one or more additives, preferably is one or more additives. In one aspect of this embodiment, the metal portion is not a 2-dimensional material. In one aspect of this embodiment, the metal portion does not contain a 2-dimensional material.

[16] The optical element according to embodiment [15], wherein the mean density of the metal portion in the cover is 24 kg/m$^2$ or less, preferably 2.4·10$^{-1}$ kg/m$^2$ or less, more preferably 2.4·10$^{-2}$ kg/m$^2$ or less, more preferably 2.4·10$^{-3}$ kg/m$^2$ or less, most preferably 1.2·10$^{-3}$ kg/m$^2$ or less.

[17] The optical element according to embodiment [15] or [16], wherein the mean density of the metal portion in the cover is 1.7·10$^{-9}$ kg/m$^2$ or more, preferably 3.4·10$^{-8}$ kg/m$^2$ or more, more preferably 1.8·10$^{-7}$ kg/m$^2$ or more. In one aspect of this embodiment, the mean density is 5·10$^{-7}$ kg/m$^2$ or more, preferably 1.5·10$^{-6}$ kg/m$^2$ or more, more preferably 5.4·10$^{-6}$ kg/m$^2$ or more, more preferably 5.7·10$^{-5}$ kg/m$^2$ or more.

[18] The optical element according to any of the embodiments [15] to [17], wherein the metal portion is present as a metal containing layer, the 2-dimensional portion preferably being present outside the metal containing layer. In one aspect of this embodiment, the cover comprises a 2-dimensional containing layer which is closer to the support than the metal containing layer. In one aspect of this embodiment, the cover comprises a 2-dimensional containing layer which is further from the support than the metal containing layer.

[19] The optical element according to embodiment [18], wherein the metal containing layer has a mean density of 24 kg/m$^2$ or less, preferably 2.4·10$^{-1}$ kg/m$^2$ or less, more preferably 2.4·10$^{-2}$ kg/m$^2$ or less, more preferably 2.4·10$^{-3}$ kg/m$^2$ or less, most preferably 1.2·10$^{-3}$ kg/m$^2$ or less.

[20] The optical element according to embodiment [18] or [19], wherein the metal containing layer has a mean density of 1.7·10$^{-9}$ kg/m$^2$ or more, preferably 3.4·10$^{-8}$ kg/m$^2$ or more, more preferably 1.8·10$^{-7}$ kg/m$^2$ or more. In one aspect of this embodiment, the mean density is 5·10$^{-7}$ kg/m$^2$ or more, preferably 1.5·10$^{-6}$ kg/m$^2$ or more, more preferably 5.4·10$^{-6}$ kg/m$^2$ or more, more preferably 5.7·10$^{-5}$ kg/m$^2$ or more.

[21] The optical element according to any of the embodiments [18] to [20], wherein the metal containing layer has a thickness of 1 mm or less, preferably 10 μm or less, more preferably 1000 nm or less, more preferably 100 nm or less, more preferably 50 nm or less.

[22] The optical element according to any of the embodiments [18] to [21], wherein the metal containing layer has a thickness of 25 pm or more, preferably 69 pm or more, more preferably 100 μm or more. In one aspect of this embodiment, the thickness is 1 nm or more, preferably 3 nm or more. In another aspect of this embodiment, the thickness is 5 nm or more, preferably 10 nm or more, more preferably 30 nm or more.

[23] The optical element according to any of the embodiments [18] to [22], wherein the metal containing layer has an electrical resistivity of less than 10$^6$ Ω·cm, preferably less than 10$^{-1}$ Ω·cm, more preferably less than 10$^{-3}$ Ω·cm, most preferably less than 10$^{-5}$ Ω·cm. The electrical resistivity might be as low as 10$^{-8}$ Ω·cm, in particular where a non-super conductive conductor is employed. The electrical resistivity might be lower than 10$^{-8}$ Ω·cm, in particular where a super conductive material is employed.

[24] The optical element according to any of the embodiments [18] to [23], wherein the metal containing layer is at a surface of the cover. In one aspect of this embodiment, the metal containing layer is at the first surface of the cover. In another aspect of this embodiment, the metal containing layer is at the second surface of the cover. In another aspect of this embodiment, a metal containing layer is present at both the first surface and the second surface of the cover. In another aspect of this embodiment, a metal containing layer is present at neither the first surface nor the second surface of the cover.

[25] The optical element according to any of the embodiments [18] to [24], wherein the metal containing layer has a value of transmittance divided by reflectance of not more than 0.5, preferably not more than 0.25, more preferably not more than 0.1, most preferably not more than 0.01, the reflectance and transmittance being measured at a wavelength λ;

wherein λ is in the range from 10 nm to 20 μm, preferably 10 nm to 2 μm, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance and transmittance are for light incident on the second surface. In one aspect of this embodiment, the transmittance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[26] The optical element according to any of the embodiments [18] to [25], wherein the metal containing layer has a value of absorbance divided by reflectance of not more than 0.5, preferably not more than 0.25, more preferably not more than 0.1, most preferably not more than 0.01, the reflectance and absorbance being measured at a wavelength λ;

wherein λ is in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of absorbance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of absorbance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance and absorbance are for light incident on the second surface. In one aspect of this embodiment, the absorbance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the absorbance and reflectance values are for light inci-dent at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

[27] The optical element according to any of the preceding embodiments, wherein the cover comprises an additive portion which is one or more elements selected from the group consisting of: Ag, Al, Au, B, Ba, Be, Bi, C, Ca, Cr, Cs, Co, Cu, Fe, Ga, Ge, H, Hf, Hg, In, Ir, K, Mg, Mn, Mo, Na, Nb, Ni, Li, Ti, Os, P, Pb, Pd, Pt, Re, Rh, Ru, S, Sb, Sc, Se, Si, Sn, Sr, Ta, Te, V, W, Zr and Zn; or one or more combinations of two or more of the previous elements, preferably alloys; or combinations of one or more of the preceding elements with one or more chalcogens (O, S, Se, Te), N or C. The preferred C in this context is amorphous C. The preferred Si in this context is amorphous Si. The preferred combination of Si and O in this context is amorphous silica ($SiO_2$). The preferred combination of Si and N in this context is amorphous silicon nitride ($Si_3N_4$). The preferred combination of Ga and N in this context is amorphous gallium nitride (GaN). The preferred combinations of In, Sn, Zn and O are amorphous indium tin oxide (ITO), amorphous indium zinc oxide (IZO), amorphous zinc oxide (ZnO) and amorphous indium tin zinc oxide (ITZO).

In one aspect of this embodiment, the additive portion is one or more elements selected from the group consisting of: Ag, Al, Au, B, Ba, C, Ca, Cr, Cs, Co, Cu, Fe, Ga, Ge, Hf, In, K, Mg, Mn, Mo, Na, Nb, Ni, Li, Ti, P, Pb, Pd, Pt, S, Sb, Se, Si, Sn, Sr, Ta, Te, V, W, Zr and Zn; or one or more combinations of two or more of the previous elements, preferably alloys; or combinations of one or more of the preceding elements with one or more chalcogens (O, S, Se, Te), N or C. The preferred C in this context is amorphous C. The preferred Si in this context is amorphous Si. The preferred combination of Si and O in this context is amorphous silica ($SiO_2$). The preferred combination of Si and N in this context is amorphous silicon nitride ($Si_3N_4$). The preferred combination of Ga and N in this context is amorphous gallium nitride (GaN). The preferred combinations of In, Sn, Zn and O are amorphous indium tin oxide (ITO), amorphous indium zinc oxide (IZO), amorphous zinc oxide (ZnO) and amorphous indium tin zinc oxide (ITZO).

In one aspect of this embodiment, the additive portion is one or more elements selected from the group consisting of: Ag, Al, B, C, Cr, Fe, K, Mg, Mo, Na, Ni, Ti, P, Pb, S, Ta, V, W and Zn; or one or more combinations of two or more of the previous elements, preferably alloys; or combinations of one or more of the preceding elements with one or more chalcogens (O, S, Se, Te), N or C. The preferred C in this context is amorphous C.

In one aspect of this embodiment, the additive portion is one or more elements selected from the group consisting of: Ag, Al, B, C, Cr, Fe, K, Mg, Mo, Na, Ni, Ti, P, Pb, S, Si, Ta, V, W and Zn; or one or more combinations of two or more of the previous elements, preferably alloys; or combinations of one or more of the preceding elements with one or more chalcogens (O, S, Se, Te), N or C. The preferred C in this context is amorphous C. The preferred Si in this context is amorphous Si. The preferred combination of Si and O in this context is amorphous silica ($SiO_2$). The preferred combination of Si and N in this context is amorphous silicon nitride ($Si_3N_4$).

In one aspect of this embodiment, the additive portion is one or more composites, a preferred composite being a polymer matrix comprising one or more nano-materials. Preferred nano-materials are selected from the group consisting of: a nanoparticle, a quantum dot, a carbon nanotube and a silver nanowire.

In another aspect, preferred nano-materials are selected from the group consisting of: a nanoparticle, a quantum dot, a carbon nanotube, a silver nanowire, an organic LED and an e-ink.

In one aspect of this embodiment, the additive portion is a combination selected from the preceding lists of elements and derived compounds and the preceding list of composites.

In one aspect of this embodiment, the additive portion comprises one or more metals, preferably is one or more metals. In one aspect of this embodiment, the additive portion comprises one or more amorphous materials, preferably is one or more amorphous materials. In one aspect of this embodiment, the additive portion is not a 2-dimensional material. In one aspect of this embodiment, the additive portion does not contain a 2-dimensional material.

[28] The optical element according to embodiment [27], wherein the mean density of the additive portion in the cover is 24 $kg/m^2$ or less, preferably $2.4 \cdot 10^{-1}$ $kg/m^2$ or less, more preferably $2.4 \cdot 10^{-2}$ $kg/m^2$ or less, more preferably $2.4 \cdot 10^{-3}$ $kg/m^2$ or less, most preferably $1.2 \cdot 10^{-3}$ $kg/m^2$ or less.

[29] The optical element according to embodiment [27] or [28], wherein the mean density of the additive portion in the cover is $1.7 \cdot 10^{-9}$ $kg/m^2$ or more, preferably $3.4 \cdot 10^{-8}$ $kg/m^2$ or more, more preferably $1.8 \cdot 10^{-7}$ $kg/m^2$ or more. In one aspect of this embodiment, the mean density is $5 \cdot 10^{-7}$ $kg/m^2$ or more, preferably $1.5 \cdot 10^{-6}$ $kg/m^2$ or more, more preferably $5.4 \cdot 10^{-6}$ $kg/m^2$ or more, more preferably $5.7 \cdot 10^{-5}$ $kg/m^2$ or more.

[30] The optical element according to any of the embodiments [27] to [29], wherein the additive portion is present as an additive containing layer, the 2-dimensional portion preferably being present outside the additive containing layer. In one aspect of this embodiment, the cover comprises a 2-dimensional containing layer which is closer to the support than the additive containing layer. In one aspect of this embodiment, the cover comprises a 2-dimensional containing layer which is further from the support than the additive containing layer.

[31] The optical element according to embodiment [30], wherein the additive containing layer has a mean density of 24 $kg/m^2$ or less, preferably $2.4 \cdot 10^{-1}$ $kg/m^2$ or less, more preferably $2.4 \cdot 10^{-2}$ $kg/m^2$ or less, more preferably $2.4 \cdot 10^{-3}$ $kg/m^2$ or less, most preferably $1.2 \cdot 10^{-3}$ $kg/m^2$ or less.

[32] The optical element according to embodiment [30] or [31], wherein the additive containing layer has a mean density of $1.7 \cdot 10^{-9}$ $kg/m^2$ or more, preferably $3.4 \cdot 10^{-8}$ $kg/m^2$ or more, more preferably $1.8 \cdot 10^{-7}$ $kg/m^2$ or more. In one aspect of this embodiment, the mean density is $5 \cdot 10^{-7}$ $kg/m^2$ or more, preferably $1.5 \cdot 10^{-6}$ $kg/m^2$ or more, more preferably $5.4 \cdot 10^{-6}$ $kg/m^2$ or more, more preferably $5.7 \cdot 10^{-5}$ $kg/m^2$ or more.

[33] The optical element according to any of the embodiments [30] to [32], wherein the additive containing layer has a thickness of 1 mm or less, preferably 10 µm or less, more preferably 1000 nm or less, more preferably 100 nm or less, more preferably 50 nm or less.

[34] The optical element according to any of the embodiments [30] to [33], wherein the additive containing layer has a thickness of 25 pm or more, preferably 69 pm or more, more preferably 100 µm or more. In one aspect of this embodiment, the thickness is 1 nm or more, preferably 3 nm or more. In another aspect of this embodiment, the thickness is 5 nm or more, preferably 10 nm or more, more preferably 30 nm or more.

[35] The optical element according to any of the embodiments [30] to [34], wherein the additive containing layer has an electrical resistivity of less than $10^6$ Ω·cm, preferably less than $10^{-1}$ Ω·cm, more preferably less than $10^{-3}$ Ω·cm, most preferably less than $10^{-5}$ Ω·cm. The electrical resistivity might be as low as $10^{-8}$ Ω·cm, in particular where a non-super conductive conductor is employed. The electrical resistivity might be lower than $10^{-8}$ Ω·cm, in particular where a super conductive material is employed.

[36] The optical element according to any of the embodiments [30] to [35], wherein the additive containing layer is at a surface of the cover. In one aspect of this embodiment, the additive containing layer is at the first surface of the cover. In another aspect of this embodiment, the additive containing layer is at the second surface of the cover. In another aspect of this embodiment, an additive containing layer is present at both the first surface and the second surface of the cover. In another aspect of this embodiment, an additive containing layer is present at neither the first surface nor the second surface of the cover.

[37] The optical element according to any of the embodiments [30] to [36], wherein the additive containing layer has a value of transmittance divided by reflectance of not more than 0.5, preferably not more than 0.25, more preferably not more than 0.1, most preferably not more than 0.01, the reflectance and transmittance being measured at a wavelength λ;

wherein λ is in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance and transmittance are for light incident on the second surface. In one aspect of this embodiment, the transmittance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[38] The optical element according to any of the embodiments [30] to [37], wherein the additive containing layer has a value of absorbance divided by reflectance of not more than 0.5, preferably not more than 0.25, more preferably not more than 0.1, most preferably not more than 0.01, the reflectance and absorbance being measured at a wavelength λ;

wherein λ is in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of absorbance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of absorbance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm. In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance and absorbance are for light incident on the second surface. In one aspect of this embodiment, the absorbance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the absorbance and reflectance values are for light inci-dent at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

[39] The optical element according to any of the preceding embodiments, wherein the 2-dimensional portion is one or more of the following:
  d. One or more selected from the group consisting of: C, BN, P, $MoS_2$, $MoSe_2$, $MoTe_2$, $WS_2$, $WSe_2$, $WTe_2$, $NbS_2$, $NbSe_2$, $NbTe_2$, $TaS_2$, $TaSe_2$, $TaTe_2$, $TiSe_2$, $VSe_2$, $CrS_2$, $CrSe_2$, B, Ge, Si, $Si_2BN$, Sn, Pb, P, Sb, Bi. The preferred C in this context is one or more selected from the group consisting of: graphene, one or more graphitic layers and graphyne; preferably graphene. The preferred BN in this context is h-BN. The preferred P in this context is black phosphorus or phosphorene. The preferred B in this context is borophene. The preferred Ge in this context is germanene. The preferred Si in this context is silicene. The preferred Sn in this context is stanene. The preferred Pb in this context is plumbene. The preferred Sb in this context is antimonene. The preferred Bi in this context is bismuthine;
  e. One or more transition metal chalcogenides, each being a transition metal chalcogenide not listed in a.;
  f. One or more oxides, each being an oxide of a species listed in a. or b.;
  g. One or more atomic intercalated variants, each being an atomic intercalated variant of a species listed in a. or b.;
  h. One or more physically, chemically, mechanically and/or electromagnetically functionalised derivatives, each being a chemically functionalised derivative of a species listed in a. or b. A preferred physical functionalisation is perforation or atomic barrage treatment. A preferred mechanical functionalisation is stretching or stressing. A preferred electromagnetic functionalisation is application of a voltage.

In one aspect of this embodiment, the 2-dimensional portion is a combination selected from the group consisting of: a., b., c., d., e., a.+b., a.+c., a.+d., a.+e., b.+c., b.+d., b.+e., c.+d., c.+e., d.+e., a.+b.+c., a.+b.+d., a.+b.+e., a.+c.+d., a.+c.+e., a.+d.+e., b.+c.+d., b.+c.+e., b.+d.+e., c.+d.+e., b.+c.+d.+e., a.+c.+d.+e., a.+b.+d.+e., a.+b.+c.+e., a.+b.+c.+d. and a.+b.+c.+d.+e.

[39a] The optical element according to any of the preceding embodiments, wherein the 2-dimensional portion is one or more of the following:
  a. One or more selected from the group consisting of: C, BN, P, $MoS_2$, $MoSe_2$, $MoTe_2$, $WS_2$, $WSe_2$, $WTe_2$, GaS, GaSe, GaTe, $NbS_2$, $NbSe_2$, $NbTe_2$, $TaS_2$, $TaSe_2$, $TaTe_2$, $TiSe_2$, $VSe_2$, $CrS_2$, $CrSe_2$, B, Ge, Si, $Si_2BN$, Sn, Pb, $PtS_2$, $PtSe_2$, $PtTe_2$, Sb, Bi. The preferred C in this context is one or more selected from the group consisting of: graphene, one or more graphitic layers and graphyne, monolayer amorphous carbon; preferably graphene. The preferred BN in this context is h-BN. The preferred P in this context is black phosphorus or phosphorene. The preferred B in this context is borophene. The preferred Ge in this context is germanene. The preferred Si in this context is silicene. The preferred Sn in this context is stanene. The preferred Pb in this context is plumbene. The preferred Sb in this context is antimonene. The preferred Bi in this context is bismuthine;
  b. One or more transition metal chalcogenides, each being a transition metal chalcogenide not listed in a.;
  c. One or more oxides, each being an oxide of a species listed in a. or b.;
  d. One or more atomic intercalated variants, each being an atomic intercalated variant of a species listed in a. or b.;
  e. One or more physically, chemically, mechanically and/or electromagnetically functionalised derivatives, each being a chemically functionalised derivative of a species listed in a. or b. A preferred physical functionalisation is perforation or atomic barrage treatment. A preferred mechanical functionalisation is stretching or stressing. A preferred electromagnetic functionalisation is application of a voltage.

In one aspect of this embodiment, the 2-dimensional portion is a combination selected from the group consisting of: a., b., c., d., e., a.+b., a.+c., a.+d., a.+e., b.+c., b.+d., b.+e., c.+d., c.+e., d.+e., a.+b.+c., a.+b.+d., a.+b.+e., a.+c.+d., a.+c.+e., a.+d.+e., b.+c.+d., b.+c.+e., b.+d.+e., c.+d.+e., b.+c.+d.+e., a.+c.+d.+e., a.+b.+d.+e., a.+b.+c.+e., a.+b.+c.+d. and a.+b.+c.+d.+e.

In one embodiment, a 2-dimensional material is present in a nano-sheet solution or a composite. A preferred composite is a polymer matrix comprising one or more 2-dimensional materials, preferably being selected according to the preceding embodiment. A preferred nanosheet solution comprises one or more 2-dimensional materials, preferably being selected according to the preceding embodiment.

[40] The optical element according to any of the preceding embodiments, wherein the 2-dimensional portion comprises graphene or boron nitride or both. A preferred boron nitride is hexagonal boron nitride. Graphene is preferably chemical vapour deposited. Boron nitride is preferably chemical vapour deposited. In one aspect of this embodiment, the 2-dimensional portion comprises graphene, preferably is graphene. In one aspect of this embodiment, the 2-dimensional portion comprises boron nitride, preferably is boron nitride.

[41] The optical element according to any of the preceding embodiments, wherein the 2-dimensional portion is two or more 2-dimensional materials. In one aspect of this embodiment, each of the two or more 2-dimensional materials is selected from the lists of embodiment [39].

[42] The optical element according to any of the preceding embodiments, wherein the mean density of the 2-dimensional portion in the cover is 24 kg/m$^2$ or less, preferably $2.4 \cdot 10^{-1}$ kg/m$^2$ or less, more preferably $2.4 \cdot 10^{-2}$ kg/m$^2$ or less, more preferably $2.4 \cdot 10^{-3}$ kg/m$^2$ or less, most preferably $1.2 \cdot 10^{-3}$ kg/m$^2$ or less.

[43] The optical element according to any of the preceding embodiments, wherein the mean density of the 2-dimensional portion in the cover is $1.7 \cdot 10^{-9}$ kg/m$^2$ or more, preferably $3.4 \cdot 10^{-8}$ kg/m$^2$ or more, more preferably $1.8 \cdot 10^{-7}$ kg/m$^2$ or more. In one aspect of this embodiment, the mean density is $5 \cdot 10^{-7}$ kg/m$^2$ or more, preferably $1.5 \cdot 10^{-6}$ kg/m$^2$ or more, more preferably $5.4 \cdot 10^{-6}$ kg/m$^2$ or more, more preferably $5.7 \cdot 10^{-5}$ kg/m$^2$ or more.

[44] The optical element according to any of the preceding embodiments, wherein the 2-dimensional portion comprises one or more sheets of 2-dimensional material.

[45] The optical element according to any of the preceding embodiments, wherein the 2-dimensional portion is present as a 2-dimensional containing layer.

[46] The optical element according to embodiment [45], wherein the mean density of the 2-dimensional containing layer is 24 kg/m$^2$ or less, preferably $2.4 \cdot 10^{-1}$ kg/m$^2$ or less, more preferably $2.4 \cdot 10^{-2}$ kg/m$^2$ or less, more preferably $2.4 \cdot 10^{-3}$ kg/m$^2$ or less, most preferably $1.2 \cdot 10^{-3}$ kg/m$^2$ or less.

[47] The optical element according to embodiment [45] or [46], wherein the mean density of the 2-dimensional containing layer is $1.7 \cdot 10^{-9}$ kg/m$^2$ or more, preferably $3.4 \cdot 10^{-8}$ kg/m$^2$ or more, more preferably $1.8 \cdot 10^{-7}$ kg/m$^2$ or more. In one aspect of this embodiment, the mean density is $5 \cdot 10^{-7}$ kg/m$^2$ or more, preferably $1.5 \cdot 10^{-6}$ kg/m$^2$ or more, more preferably $5.4 \cdot 10^{-6}$ kg/m$^2$ or more, more preferably $5.7 \cdot 10^{-5}$ kg/m$^2$ or more.

[48] The optical element according to any of the embodiments [45] to [47], wherein the 2-dimensional containing layer has an electrical resistivity, measured in a direction in the plane of the layer, of less than $10^6$ $\Omega \cdot$cm, preferably less than $10^{-1}$ $\Omega \cdot$cm, more preferably less than $10^{-3}$ $\Omega \cdot$cm, most preferably less than $10^{-5}$ $\Omega \cdot$cm. The electrical resistivity might be as low as $10^{-8}$ $\Omega \cdot$cm, in particular where a non-super conductive conductor is employed. The electrical resistivity might be lower than $10^{-8}$ $\Omega \cdot$cm, in particular where a super conductive material is employed.

[49] The optical element according to any of the embodiments [45] to [48], wherein the 2-dimensional containing layer is one or more sheets of 2-dimensional material.

[50] The optical element according to any of the embodiments [45] to [49], wherein the 2-dimensional containing layer has a thickness of 1 mm or less, preferably 10 μm or less, more preferably 1000 nm or less, more preferably 100 nm or less, more preferably 50 nm or less. In one aspect of this embodiment, more preferably 10 nm or less, more preferably 5 nm or less, most preferably 1 nm or less.

[51] The optical element according to any of the embodiments [45] to [50], wherein the 2-dimensional containing layer has a thickness of 25 pm or more, preferably 69 pm or more, more preferably 100 μm or more. In one aspect of this embodiment, the thickness is 1 nm or more, preferably 3 nm or more, more preferably 5 nm or more, more preferably still 10 nm or more. In another aspect of this embodiment, the thickness is 15 nm or more, preferably 20 nm or more, more preferably 30 nm or more.

[52] The optical element according to any of the embodiments [45] to [51], wherein the 2-dimensional containing layer is at a surface of the cover. In one aspect of this embodiment, the 2-dimensional containing layer is at the first surface of the cover. In another aspect of this embodiment, the 2-dimensional containing layer is at the second surface of the cover. In another aspect of this embodiment, a 2-dimensional containing layer is present at both the first surface and the second surface of the cover. In another aspect of this embodiment, a 2-dimensional containing layer is present at neither the first surface nor the second surface of the cover.

[53] The optical element according to any of the preceding embodiments, wherein the cover has a value of absorbance divided by reflectance of not more than 0.5, preferably not more than 0.25, more preferably not more than 0.1, most preferably not more than 0.01, for light incident on the second surface, the reflectance and transmittance being measured at a wavelength λ;
wherein λ is in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance and transmittance are for light incident on the second surface. In one aspect of this embodiment, the transmittance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

In one aspect of this embodiment, the value of absorbance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of absorbance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the absorbance and transmittance are for light incident on the second surface. In one aspect of this embodiment, the transmittance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the absorbance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[53a] The optical element according to any of the preceding embodiments, wherein the cover has a value of transmittance divided by reflectance of not more than 0.5, preferably not more than 0.25, more preferably not more than 0.1, most preferably not more than 0.01, for light incident on the second surface, the reflectance and transmittance being measured at a wavelength wherein λ is in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance and transmittance are for light incident on the second surface. In one aspect of this embodiment, the transmittance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[53b] The optical element according to any of the preceding embodiments, wherein the cover has a value of absorbance divided by reflectance of not more than 0.5, preferably not more than 0.25, more preferably not more than 0.1, most preferably not more than 0.01, for light incident on the second surface, the reflectance and absorbance being measured at a wavelength λ;
wherein λ is in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of absorbance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of absorbance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm. In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance and absorbance are for light incident on the second surface. In one aspect of this embodiment, the absorbance and reflectance values are for light incident at an angle θ from a normal to the second surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the absorbance and reflectance values are for light inci-dent at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[54] The optical element according to any of the preceding embodiments, wherein the cover has a thickness of 1 mm or less, preferably 10 μm or less, more preferably 1000 nm or less, more preferably 100 nm or less, more preferably 50 nm or less.

[55] The optical element according to any of the preceding embodiments, wherein the cover has a thickness of 25 pm or more, preferably 69 pm or more, more preferably 100 μm or more. In one aspect of this embodiment, the thickness is 1 nm or more, preferably 3 nm or more, more preferably 5 nm or more, more preferably still 10 nm or more. In another aspect of this embodiment, the thickness is 15 nm or more, preferably 20 nm or more, more preferably 30 nm or more.

[56] The optical element according to any of the preceding embodiments, wherein the cover has a laminar form.

[57] The optical element according to any of the preceding embodiments, wherein the means produces an electrostatic force.

[58] The optical element according to any of the preceding embodiments, wherein the means is adapted and arranged to produce a potential difference between the cover and a terminal. In one aspect of this embodiment, the terminal is located closer to the first surface than to the second surface. In another aspect of this embodiment, the terminal is located closer to the second surface than to the first surface. In another aspect of this embodiment, a first terminal is located closer to the first surface than to the second surface and a second terminal is located closer to the second surface than to the first surface. In one aspect of this embodiment, a terminal is present in a substrate. In one aspect of this embodiment, a terminal is present in a casing.

[59] The optical element according to any of the preceding embodiments, wherein the means is adapted and arranged to alter a pressure in a region at the first surface. In one aspect of this embodiment, the pressure is a gas pressure. In another aspect of this embodiment, the pressure is a liquid pressure.

[60] The optical element according to any of the preceding embodiments, wherein, in the first cover contour profile a first point in the cover is at a first spatial location relative to the support and in the second cover contour profile the first point is at a second spatial position relative to the support, wherein the distance between the first spatial position and the second spatial position is in the range from 0.1 nm to 2000 nm, preferably from 1 nm to 1000 nm. In one aspect of this embodiment, preferably in the range from 5 nm to 800 nm. In another aspect of this embodiment, more preferably in the range from 5 nm to 400 nm. In another aspect of this embodiment, more preferably in the range from 1 nm to 100 nm.

[61] The optical element according to any of the preceding embodiments, wherein movement from the first cover contour profile to the second cover contour profile alters an altitude of a point on the cover by an amount in the range from 0.1 nm to 2000 nm, preferably from 1 nm to 1000 nm, the altitude being defined with reference to a plane of the support. In one aspect of this embodiment, the altitude is changed by an amount in the range from 5 nm to 800 nm. In another aspect of this embodiment, the altitude is changed by an amount in the range from 5 nm to 400 nm. In another aspect of this embodiment, the altitude is changed by an amount in the range from 1 nm to 100 nm. In one aspect of this embodiment, the plane of the support is defined by the points of attachment between the cover and the support. In another aspect, the plane of the support is a face of the support. In another aspect, the plane of the support is a partial face of the support. In one aspect of this embodiment, the altitude is altered at multiple points on the cover by amounts in the above ranges, preferably at least 10% by area of the cover, more preferably at least 50% by area of the cover, more preferably at least 80% by area of the cover.

In one aspect of this embodiment, the altitude is altered at multiple points on the cover by amounts in the above ranges, preferably at least for 10% of the area of the second surface of the cover from the first cover contour profile, more preferably at least for 50% of the area of the second surface of the cover from the first cover contour profile, more preferably at least for 80% of the area of the second surface of the cover from the first cover contour profile.

[62] The optical element according to any of the preceding embodiments, further comprising a substrate having a substrate surface, wherein a part of the substrate surface is attached to the support, the part preferably not being more than 60 area % of the substrate surface, more preferably not more than 20 area % of the substrate surface, most preferably not more than 5 area % of the substrate surface.

[63] The optical element according to embodiment [62], wherein the substrate surface, the support and the first surface border one or more cavities, each cavity having a cavity depth being a distance in the cavity between the substrate surface and the first surface.

[64] The optical element according to embodiment [63], wherein the one or more cavities are one or more selected from the group consisting of: a pore, a channel and a gallery.

[65] The optical element according to embodiment [63] or [64], wherein one or more of the cavities depths in the first cover contour profile is the range from 0 to 5000 nm, preferably in the range from 0 to 2000 nm. In one aspect of this embodiment, preferably in the range from 0 nm to 1600 nm. In another aspect of this embodiment, more preferably in the range from 0 nm to 800 nm. In another aspect of this embodiment, more preferably in the range from 0 nm to 200 nm [66] The optical element according to any of the embodiments [63] to [65], wherein a cavity has a first cavity depth in the first cover contour profile and a second cavity depth in the second cover contour profile, wherein the difference between the first and second depths is in the range from 0.1 nm to 2000 nm, preferably from 1 nm to 1000 nm. In one aspect of this embodiment, preferably in the range from 5 nm to 800 nm. In another aspect of this embodiment, more preferably in the range from 5 nm to 400 nm. In another aspect of this embodiment, more preferably in the range from 1 nm to 100 nm.

[67] The optical element according to any of the embodiments [62] to [66], wherein the substrate has one or more of the following:
 a. a transmittance of at least 0.2, preferably at least 0.5, more preferably at least 0.8, most preferably at least 0.9;
 b. a reflectance below 0.5, preferably below 0.3, preferably below 0.2, preferably below 0.1; and
 c. an absorbance at least 0.01, preferably at least 0.1, preferably at least 0.25, most preferably at least 0.5.

In one aspect of this embodiment, the satisfied features are a combination selected from the group consisting of: a., b., c., a.+b., a.+c., b.+c. and a.+b.+c.

In one aspect of this embodiment, the criteria are satisfied for a wavelength λ in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of reflectance divided by transmittance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.
 In one aspect of this embodiment, the value of reflectance divided by transmittance is 0.5 or less, preferably 0.25 or less, more preferably 0.1 or less, most preferably 0.01 for all wavelengths λ in the range from 380 nm to 740 nm.
 In one aspect of this embodiment, the value of reflectance divided by transmittance is 0.5 or less, preferably 0.25 or less, more preferably 0.1 or less, most preferably 0.01 for all wavelengths λ in the range from 13 to 193 nm, preferably for all wavelengths in the range from 10 to 200 nm.
 In one aspect of this embodiment, the value of reflectance divided by transmittance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance, absorbance and transmittance are for light incident on the substrate surface. In one aspect of this embodiment, the transmittance, absorbance and reflectance values are for light incident at an angle θ from a normal to the substrate surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

[68] The optical element according to any of the embodiments [62] to [67], wherein the substrate has one or more of the following:
  a. a transmittance below 0.5, preferably below 0.3, preferably below 0.2, preferably below 0.1;
  b. a reflectance below 0.5, preferably below 0.3, preferably below 0.2, preferably below 0.1; and
  c. an absorbance at least 0.5, preferably at least 0.8, preferably at least 0.9, most preferably at least 0.95.

In one aspect of this embodiment, the satisfied features are a combination selected from the group consisting of: a., b., c., a.+b., a.+c., b.+c. and a.+b.+c.

In one aspect of this embodiment, the criteria are satisfied for a wavelength λ in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 μm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of transmittance divided by absorbance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by absorbance is 0.5 or less, preferably 0.25 or less, more preferably 0.1 or less, most preferably 0.01 for all wavelengths λ in the range from 13 to 193 nm, preferably for all wavelengths in the range from 10 to 200 μm.

In one aspect of this embodiment, the value of transmittance divided by absorbance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of reflectance divided by absorbance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of reflectance divided by absorbance is 0.5 or less, preferably 0.25 or less, more preferably 0.1 or less, most preferably 0.01 for all wavelengths λ in the range from 380 nm to 740 nm.

In one aspect of this embodiment, the value of reflectance divided by absorbance is 0.5 or less, preferably 0.25 or less, more preferably 0.1 or less, most preferably 0.01 for all wavelengths λ in the range from 13 to 193 nm, preferably for all wavelengths in the range from 10 to 200 μm. In one aspect of this embodiment, the value of reflectance divided by absorbance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance, absorbance and transmittance are for light incident on the substrate surface. In one aspect of this embodiment, the transmittance, absorbance and reflectance values are for light incident at an angle θ from a normal to the substrate surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

[69] The optical element according to any of the embodiments [62] to [67], wherein the substrate has one or more of the following:
  a. a transmittance below 0.5, preferably below 0.3, preferably below 0.2, preferably below 0.1;
  b. a reflectance of at least 0.5, preferably at least 0.8, more preferably at least 0.9, most preferably at least 0.95; and
  c. an absorbance below 0.5, preferably below 0.3, preferably below 0.2, preferably below 0.1.

In one aspect of this embodiment, the satisfied features are a combination selected from the group consisting of: a., b., c., a.+b., a.+c., b.+c. and a.+b.+c. 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of absorbance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of absorbance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm. In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the reflectance, absorbance and transmittance are for light incident on the substrate surface. In one aspect of this embodiment, the transmittance, absorbance and reflectance values are for light incident at an angle θ from a normal to the substrate surface, θ being in the range from 0 to 85°. In one aspect, θ is 0°. In another aspect θ is 15°. In another aspect θ is 30°. In another aspect θ is 45°. In an-other aspect θ is 60°. In another aspect θ is 75°.

[70] The optical element according to any of the embodiments [62] to [69], wherein the substrate has an electrical resistivity of less than $10^6$ Ω·cm, preferably less than $10^{-1}$ Ω·cm, more preferably less than $10^{-3}$ Ω·cm, most preferably less than $10^{-5}$ Ω·cm. The electrical resistivity might be as low as $10^{-8}$ Ω·cm, in particular where a non-super conductive conductor is employed. The electrical resistivity might be lower than $10^{-8}$ Ω·cm, in particular where a super conductive material is employed.

[72] The optical element according to any of the embodiments [62] to [70], wherein the substrate has a surface layer on the substrate surface comprising one or more two-dimensional materials. In one aspect of this embodiment, each of the one or more 2-dimensional materials is selected from the lists of embodiment [39].

[73] The optical element according to any of the embodiments [62] to [71], wherein the substrate has a thickness of less than 100 mm, preferably less than 1 mm, more preferably less than 500 μm. In one aspect of this embodiment, preferably less than 100 μm, most preferably less than 1 μm.

[73] The optical element according to any of the preceding embodiments, wherein the support has an electrical resistivity of more than $10^6$ Ω·cm, preferably more than $10^{10}$ Ω·cm, more preferably more than $10^{14}$ Ω·cm, most preferably more than $10^{18}$ Ω·cm.

[74] The optical element according to any of the embodiments [1] to [72], wherein the support has an electrical resistivity of less than $10^6$ Ω·cm, preferably less than $10^{-1}$ Ω·cm, more preferably less than $10^{-3}$ Ω·cm, most preferably less than $10^{-5}$ Ω·cm.

[75] The optical element according to any of the preceding embodiments, wherein the support has a dielectric strength of more than 0.05 MV/m, more preferably more than 1 MV/m, more preferably more than 10 MV/m, more preferably more than 20 MV/m, most preferably more than 40 MV/m.

[76] The optical element according to any of the preceding embodiments, wherein the support has one or more of the following:
  a. a transmittance of at least 0.2, preferably at least 0.5, more preferably at least 0.8, most preferably at least 0.9;
  b. a reflectance below 0.5, preferably below 0.3, preferably below 0.2, preferably below 0.1; and
  c. an absorbance at least 0.01, preferably at least 0.1, preferably at least 0.25, most preferably at least 0.5.

In one aspect of this embodiment, the satisfied features are a combination selected from the group consisting of: a., b., c., a.+b., a.+c., b.+c. and a.+b.+c.

In one aspect of this embodiment, the criteria are satisfied for a wavelength λ in the range from 10 nm to 20 μm, preferably 10 nm to 2 μm. In one aspect, most preferably 380 nm to 740 nm.

In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of reflectance divided by transmittance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of reflectance divided by transmittance is 0.5 or less, preferably 0.25 or less, more preferably 0.1 or less, most preferably 0.01 for all wavelengths λ in the range from 380 nm to 740 nm.

In one aspect of this embodiment, the value of reflectance divided by transmittance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of reflectance divided by transmittance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm In one aspect of this embodiment, the reflectance, absorbance and transmittance are for light incident on the support surface. In one aspect of this embodiment, the transmittance, absorbance and reflectance values are for light incident at an angle θ from a normal to the support surface, θ being in the range from 0 to 85°. In one aspect, θ is 0°. In another aspect θ is 15°. In another aspect θ is 30°. In another aspect θ is 45°. In another aspect θ is 60°. In another aspect θ is 75°.

In one aspect of this embodiment, the absorbance, transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[76a] The optical element according to any of the preceding embodiments, wherein the support has one or more of the following:
  a. a transmittance below 0.5, preferably below 0.3, preferably below 0.2, preferably below 0.1;
  b. a reflectance below 0.5, preferably below 0.3, preferably below 0.2, preferably below 0.1; and
  c. an absorbance at least 0.5, preferably at least 0.8, preferably at least 0.9, most preferably at least 0.95.

In one aspect of this embodiment, the satisfied features are a combination selected from the group consisting of: a., b., c., a.+b., a.+c., b.+c. and a.+b.+c.

In one aspect of this embodiment, the criteria are satisfied for a wavelength λ in the range from 10 nm to 20 μm, preferably 10 nm to 2 μm. In one aspect, most preferably 380 nm to 740 nm.

In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by absorbance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by absorbance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by absorbance is 0.5 or less, preferably 0.25 or less, more preferably 0.1 or less, most preferably 0.01 for all wavelengths λ in the range from 13 to 193 nm, preferably for all wavelengths in the range from 10 to 200 μm.

In one aspect of this embodiment, the value of transmittance divided by absorbance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of reflectance divided by absorbance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of reflectance divided by absorbance is 0.5 or less, preferably 0.25 or less, more preferably 0.1 or less, most preferably 0.01 for all wavelengths λ in the range from 380 nm to 740 nm.

In one aspect of this embodiment, the value of reflectance divided by absorbance is 0.5 or less, preferably 0.25 or less, more preferably 0.1 or less, most preferably 0.01 for all wavelengths λ in the range from 13 to 193 nm, preferably for all wavelengths in the range from 10 to 200 μm. In one aspect of this embodiment, the value of reflectance divided by absorbance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the absorbance, transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[76b] The optical element according to any of the preceding embodiments, wherein the support has one or more of the following:
  a. a transmittance below 0.5, preferably below 0.3, preferably below 0.2, preferably below 0.1;
  b. a reflectance of at least 0.5, preferably at least 0.8, more preferably at least 0.9, most preferably at least 0.95; and
  c. an absorbance below 0.5, preferably below 0.3, preferably below 0.2, preferably below 0.1.

In one aspect of this embodiment, the satisfied features are a combination selected from the group consisting of: a., b., c., a.+b., a.+c., b.+c. and a.+b.+c.

10 nm to 20 μm, preferably 10 nm to 2 μm. In one aspect, most preferably 380 nm to 740 nm.

In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of absorbance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of absorbance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm. In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the absorbance, transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°. In another aspect θ is 60°. In another aspect θ is 75°. The contact plane is defined by the points of contact between the first surface and the support. In one aspect, the contact plane is a root mean square fit to the points of contact.

[77] A process for the preparation of an optical element comprising the following process steps, which can be performed in any order:
  a. Providing a support;
  b. attaching a cover to the support, wherein the cover comprises a 2-dimensional material;
  c. providing a means for altering the position of the cover in relation to the support;
  wherein the cover has a value of transmittance divided by reflectance of not more than 0.5, preferably not more than 0.25, more preferably not more than 0.1, most preferably not more than 0.01, the reflectance and transmittance being measured at a wavelength λ; and
  wherein λ is in the range from 10 nm to 20 μm, preferably 10 nm to 2 μm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, λ is 532 nm. It is preferred according to this aspect for optical measurements to be made using a frequency doubled Nd YAG laser.

In one aspect of this embodiment, λ is 476 nm. It is preferred according to this aspect for optical measurements to be made using a blue Kr laser.

In one aspect of this embodiment, λ is 594 nm. It is preferred according to this aspect for optical measurements to be made using a yellow He—Ne laser.

In one aspect of this embodiment, λ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of transmittance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of reflectance divided by transmittance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of reflectance divided by transmittance is 0.5 or less, preferably 0.25 or less, more preferably 0.1 or less, most preferably 0.01 for all wavelengths λ in the range from 380 nm to 740 nm.

In one aspect of this embodiment, the value of reflectance divided by transmittance is 0.5 or less, preferably 0.25 or less, more preferably 0.1 or less, most preferably 0.01 for all wavelengths λ in the range from 13 to 193 nm, preferably for all wavelengths in the range from 10 to 200 nm.

In one aspect of this embodiment, the value of reflectance divided by transmittance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm In one aspect of this embodiment, the value of transmittance divided by absorbance is 0.5 or less, preferably 0.25 or less, more preferably 0.1 or less, most preferably 0.01 for all wavelengths λ in the range from 380 nm to 740 nm.

In one aspect of this embodiment, the value of transmittance divided by absorbance is 0.5 or less, preferably 0.25 or less, more preferably 0.1 or less, most preferably 0.01 for all wavelengths λ in the range from 13 to 193 nm, preferably for all wavelengths in the range from 10 to 200 μm.

In one aspect of this embodiment, the value of transmittance divided by absorbance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of reflectance divided by absorbance is 0.5 or less, preferably 0.25 or less, more preferably 0.1 or less, most preferably 0.01 for all wavelengths λ in the range from 10 nm to 2 μm, preferably for all wavelengths in the range from 10 nm to 20 μm.

In one aspect of this embodiment, the value of reflectance divided by absorbance is 0.5 or less, preferably 0.25 or less, more preferably 0.1 or less, most preferably 0.01 for all wavelengths λ in the range from 380 nm to 740 nm.

In one aspect of this embodiment, the value of reflectance divided by absorbance is 0.5 or less, preferably 0.25 or less, more preferably 0.1 or less, most preferably 0.01 for all wavelengths λ in the range from 13 to 193 nm, preferably for all wavelengths in the range from 10 to 200 µm. In one aspect of this embodiment, the value of reflectance divided by absorbance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the value of absorbance divided by reflectance is 0.5 or less, preferably 0.25 or less, more preferably 0.1 or less, most preferably 0.01 for all wavelengths λ in the range from 10 nm to 2 µm, preferably for all wavelengths in the range from 10 nm to 20 µm.

In one aspect of this embodiment, the value of absorbance divided by reflectance is 0.5 or less, preferably 0.25 or less, more preferably 0.1 or less, most preferably 0.01 for all wavelengths λ in the range from 380 nm to 740 nm.

In one aspect of this embodiment, the value of absorbance divided by reflectance is 0.5 or less, preferably 0.25 or less, more preferably 0.1 or less, most preferably 0.01 for all wavelengths λ in the range from 13 to 193 nm, preferably for all wavelengths in the range from 10 to 200 nm. In one aspect of this embodiment, the value of absorbance divided by reflectance is 0.5 or less, preferably 0.25 or less, more preferably 0.1 or less, most preferably 0.01 for all wavelengths λ in the range from 850 to 1550 nm, preferably for all wavelengths in the range from 700 to 2000 nm.

In one aspect of this embodiment, the transmittance and reflectance values are for light incident at an angle θ from a normal to a contact plane, θ being in the range from 0 to 85°. In one aspect, θ is 0°. In another aspect θ is 15°. In another aspect θ is 30°. In another aspect θ is 45°.

In another aspect θ is 60°. In another aspect θ is 75°. The contact plane is defined by the points of contact between the first surface and the support. In one aspect, the contact plane is a root mean square fit to the points of contact.

In one aspect of this embodiment, the cover comprises an amorphous portion, a metal portion or an additive portion described elsewhere, or a combination thereof.

In one embodiment, the 2-dimensional material is one or more selected from the lists of embodiment [39].

In one aspect of this embodiment, step b) comprises the following:
B1) Forming the 2-dimensional material on the support;
B2) Applying one or more further materials to the 2-dimensional material to obtain the coyer.

In one aspect of this embodiment, step b) comprises the following:
B1) Providing a 2-dimensional material;
B2) Attaching the 2-dimensional material to the support;
B3) Applying one or more further materials to the 2-dimensional material to obtain the cover.

In one aspect of this embodiment, step b) comprises the following:
B1) Providing a 2-dimensional material;
B2) Applying one or more further materials to the 2-dimensional material to obtain the coyer;
B3) Attaching the cover to the support.

In one aspect of this embodiment, the attachment in step b. comprises application of the support on the cover, preferably formation of the support on the cover.

[78] The process according to embodiment [77], including a step of removing part of the support.

[79] An optical element obtainable by the process according to embodiment [78].

[80] A device comprising an optical element according to any of the embodiments [1] to [76] or [79].

[81] The device according to embodiment [80], wherein the device is one or more selected from the group consisting of: an adjustable optical mirror, an adjustable optical reflection and/or transmission diffuser, an adjustable optical reflection and/or transmission diffraction grating, an adjustable optical reflection and/or transmission filter, an adjustable optical reflection and/or transmission modulator, an adjustable optical reflection and/or transmission collector, an adjustable optical reflection and/or transmission lens, an adjustable mirror surface, an adjustable light-sail, an adjustable holographic imager, an adjustable attenuator, an adjustable beam splitter, an adjustable beam displacer, an adjustable optical refractor, an adjustable optical switch, an adjustable zone plate, an adjustable waveplate, an adjustable shutter, an adjustable diaphragm, an adjustable phase modulator, an adjustable microdisplay, an adjustable image sensor, an adjustable camera sensor, an adjustable spectrometer, an adjustable light concentrator, an adjustable optical component for LiFi wireless communication, an adjustable optical component for LIDAR system, an adjustable optical component for gas filtration, an adjustable optical component for liquid filtration, an adjustable optical component for reverse osmosis, an adjustable optical component for metrology, an adjustable optical component for medical technology, an adjustable optical component for windmills, an adjustable quantum sensor, an adjustable radiometer, an adjustable solar panel, an adjustable sunshade and an adjustable window.

[81a] The device according to embodiment [80], wherein the device is one or more selected from the group consisting of: an adjustable optical mirror, an adjustable optical reflection and/or transmission diffuser, an adjustable optical reflection and/or transmission diffraction grating, an adjustable optical reflection and/or transmission filter, an adjust-able optical reflection and/or transmission modulator, an adjustable optical reflection and/or transmission collector, an adjustable optical reflection and/or transmission lens, an adjustable mirror surface, an adjustable light-sail, an adjustable holographic imager, an adjustable attenuator, an adjustable beam splitter, an adjustable beam displacer, an adjustable optical refractor, an adjustable optical switch, an adjustable zone plate, an adjustable waveplate, an adjustable shutter, an adjustable diaphragm, an adjustable phase modulator, an adjustable microdisplay, an adjustable image sensor, an adjustable camera sensor, an adjustable spectrometer, an adjustable light concentrator, an adjustable optical component for LiFi wireless communication, an adjustable optical component for LIDAR system, an adjustable optical component for gas filtration, an adjustable optical component for liquid filtration, an adjustable optical component for reverse osmosis, an adjustable optical component for metrology, an adjustable optical component for medical technology, an adjustable optical component for windmills, an adjustable microphone, an adjustable speaker, an adjustable quantum sensor, an adjustable radiometer, an adjustable solar panel, an adjustable sunshade and an adjustable window.

[82] A use of a coated 2-dimensional material in an adjustable optical device.

[83] A use of a coated 2-dimensional material in an adjustable optical device for increasing operational frequency.

[84] A use of a coated 2-dimensional material for reducing the mass of an adjustable optical device.

[86] A use of a coated 2-dimensional material for increasing the mechanical strength of an adjustable optical device.

[86] A use of a coated 2-dimensional material for increasing the durability of an adjustable optical device.

[87] A use of a coated 2-dimensional material for reducing the power consumption of an adjustable optical device.

[88] A use of a coated 2-dimensional material for increasing the reflectance of an adjustable optical device.

[89] A use of a coated 2-dimensional material for increasing the thrust in a light responsive device, preferably in a light sail.

[90] A use of an optical element according to any of the embodiments [1] to [76] or [79] for improving operational frequency of an adjustable optical device.

[91] A use of an optical element according to any of the embodiments [1] to [76] or [79] for reducing the mass of an adjustable optical device.

[92] A use of an optical element according to any of the embodiments [1] to [76] or [79] for improving mechanical strength of an adjustable optical device.

[93] A use of an optical element according to any of the embodiments [1] to [76] or [79] for improving durability of an adjustable optical device.

[94] A use of an optical element according to any of the embodiments [1] to [76] or [79] for reducing power consumption of an adjustable optical device.

[95] A use of an optical element according to any of the embodiments [1] to [76] or [79] for improving reflectance of an adjustable optical device.

[96] A use of an optical element according to any of the embodiments [1] to [76] or [79] for improving the thrust in a light responsive device, preferably in a light sail.

Further uses of an optical element or a device according to this disclosure are one or more of the following:
increasing thermal conductance
increasing dynamic range
wavelength control and large continuous tuneability
angle control and large continuous tuneability
increasing data transmission bandwidth
reducing manufacturing complexity
increasing effect homogeneity
increasing thermal stability Further uses of a coated 2-dimensional material according to this disclosure are one or more of the following:
increasing thermal conductance
increasing dynamic range
wavelength control and large continuous tuneability
angle control and large continuous tuneability
increasing data transmission bandwidth
reducing manufacturing complexity
increasing effect homogeneity
increasing thermal stability Mean Densities Mean densities are given for laminar objects in this document. Mean densities are presented as a mass per unit area. A mean density is calculated by taking a mass over an entire area and dividing by the area.

The mean density of an object is the mass of the object divided by its area.

The mean density of a constituent of an object is the total mass of the constituent of the object divided by the area of the object.

Wavelengths

Wavelengths presented in this document are vacuum wavelengths, namely the wavelength which radiation would have, were it travelling in a vacuum.

Optical Element

A preferred optical element according to this disclosure is adapted and arranged to have adjustable scattering properties, reflection properties, interference properties or a combination thereof. A preferred optical element presents a surface, wherein the scattering, reflection or interference behaviour of the surface can be adjusted. A preferred optical element has a cover, a support and a means, wherein the means is adapted and adjusted to move the cover.

Cover

The optical element comprises a cover. The cover is adjustable, in particular to allow the scattering, reflection and/or interference properties of the optical element to be adjusted.

A preferred cover is a lamina. A preferred cover has two dimensions of laminar extension and a thickness perpendicular to both dimensions of laminar extension. A preferred cover has a laminar area which is at least 25 times the square of the thickness, preferably at least 1,000 times, more preferably at least 10,000 times. A lamina may have a substantially planar form. A lamina may have a non-planar form.

The cover has a first surface and a second surface. The first and second surfaces are preferably the two faces of a lamina.

The cover is attached to the support via the first surface. Attachment of the cover to the support is preferably at points or lines on the first surface or a combination of both. In one embodiment the attachment of the cover to the support includes a point, the point having a surface area of 1 mm$^2$ or less. In one embodiment the attachment of the cover to the support includes a line, the line having a thickness 1 mm or less. Such a line may be straight or deviating.

The cover is preferably flexible. The cover is preferably sufficiently flexible to allow a point on its surface to be movable between two positions at least 10 nm apart, preferably at least 50 nm, more preferably at least 100 nm.

The spatial position of the cover defines a cover contour profile in relation to the support. The support acts as a frame of reference for spatial positions of points in the cover. A cover contour profile is defined by the spatial position of every point in the cover in relation to the support. A cover contour profile determines a shape for the cover. The cover contour profile is described in terms of the second surface, but could equivalently be described in terms of the first surface. The second surface may remain parallel to the first surface.

In one embodiment, the cover may be moved such that a section moves without changing its orientation, preferably at least 10 area % of the cover, more preferably at least 20 area %, more preferably at least 50 area %. This motion preferably corresponds to an up and down motion of a flat section of the cover.

The cover may comprise one or more layers, preferably two or more layers. In one embodiment, the cover comprises a 2-dimensional containing layer, the 2-dimensional containing layer comprising one or more 2-dimensional materials, preferably being one or more 2-dimensional materials. In one embodiment, the cover comprises a further layer which is not the 2-dimensional containing layer. In one embodiment, the further layer is preferably further from the support than is the 2-dimensional containing layer. The further layer is preferably a deposition layer, preferably a layer of material deposited on the 2-dimensional containing layer. In another embodiment, the further layer is preferably closer to the support than is the 2-dimensional containing layer. In another embodiment, the further layer is enclosed by 2-dimensional containing layers, one 2-dimensional containing layer being closer to the support than is the enclosed further material. In another aspect of this embodiment, two further layers are enclosing the 2-dimensional containing layer, one further material being closer to the support than is the 2-dimensional containing layer.

In one embodiment, the cover comprises less 2-dimensional material than other material, preferably less than 10 wt. % of the cover is 2-dimensional material, preferably less than 1 wt. %, more preferably less than 0.1 wt. %.

Cover Contour Profile

A cover contour profile is defined by the spatial positions of all point in the second surface in relation to the support. The cover contour profile describes a surface shape. The part of the cover which is attached to the support does not move with respect to the support. This part is in the same position in relation to the support in every cover contour profile.

In one embodiment, the support presents a partial surface. The partial surface is a surface with sections missing. Missing sections can be points, lines, areas, or a combination thereof. Preferred points have a surface area of 1 mm$^2$ or less. Preferred lines have a thickness of 1 mm or less. In one aspect of this embodiment, the partial surface is a partial planar surface. In one aspect of this embodiment, the partial surface is a partial non-planar surface. In one aspect of this embodiment, the cover is attached to the entire partial surface of the support.

In one aspect of this disclosure, the optical element comprises a substrate and a depth is defined between the cover and the substrate. The cover contour profile is a configuration of the depths.

The cover is moved between cover contour profiles by moving one or more points in the cover relative to the support. Movement between cover contour profiles can include varying one or more depths. Movement between cover contour profiles can include flexing one or more spanning sections.

Cover contour profiles describe the orientation of the cover. The normal at a point on the cover may be at a different angle in different cover contour profiles.

An altitude of a point in the cover is defined relative to a plane of the support. In one embodiment, the support is laminar, having a first surface in contact with the cover and an opposite second surface. In one aspect of this embodiment, the altitude is relative to the first surface of the support and measured in a direction perpendicular to it. In another aspect of this embodiment, the altitude is relative to the second surface of the support and measured in a direction perpendicular to it. In one aspect of this embodiment, the support is a lamina having missing sections.

In one embodiment, movement between cover contour profiles changes the altitude of one or more points in the cover.

Support

The support is something to which the cover is attached, in particular over part of the first surface. A preferred support is rigid. A preferred support is non-flexible. A preferred support constitutes a reference in relation to which the spatial position of the cover is defined.

A preferred support presents a partial surface to which the cover is attached.

A support can be prepared by providing a support material, preferably in the form of a lamina, and removing a portion of the support material. Removal of a portion of the support material preferably produces the support with a partial surface.

A support can by incomplete deposition of a support lamina. A support can be applied as a partial lamina to a 2-dimensional containing layer or a cover.

In one embodiment, the support comprises one or more columns. In another embodiment, the support comprises one or more walls.

The support can be made of a number of materials and the skilled person can select a material which he considers suitable. Preferred materials are one or more selected from the following:

One or more amorphous materials;
One or more crystalline materials;
One or more polymers;
One or more composites;
One or more glasses; and
One or more semiconductors.

One set of preferred amorphous materials is one or more elements selected from the group consisting of: Ag, Al, Au, B, Ba, Be, Bi, C, Ca, Cr, Cs, Co, Cu, Fe, Ga, Ge, H, Hf, Hg, In, Ir, K, Mg, Mn, Mo, Na, Nb, Ni, Li, Ti, Os, P, Pb, Pd, Pt, Re, Rh, Ru, S, Sb, Sc, Se, Si, Sn, Sr, Ta, Te, V, W, Zr and Zn. Other preferred amorphous materials are one or more combinations of two or more of the previous elements, preferably alloys, or compounds of those elements with chalcogens (O, S, Se, Te), N or C. The preferred C is amorphous C. The preferred Si is amorphous Si. The preferred combination of Si and O in this context is amorphous silica ($SiO_2$). The preferred combination of Si and N in this context is amorphous silicon nitride ($Si_3N_4$). The preferred combination of Ga and N in this context is amorphous gallium nitride (GaN). The preferred combinations of In, Sn, Zn and O are amorphous indium tin oxide (ITO), amorphous indium zinc oxide (IZO), amorphous zinc oxide (ZnO) and amorphous indium tin zinc oxide (ITZO).

One more preferred set of preferred amorphous materials is one or more elements selected from the group consisting of: Ag, Al, Au, B, Ba, C, Ca, Cr, Cs, Co, Cu, Fe, Ga, Ge, Hf, In, K, Mg, Mn, Mo, Na, Nb, Ni, Li, Ti, P, Pb, Pd, Pt, S, Sb, Se, Si, Sn, Sr, Ta, Te, V, W, Zr and Zn.

Other preferred amorphous materials are one or more combinations of two or more of the previous elements, preferably alloys, or compounds of those elements with chalcogens (O, S, Se, Te), N or C. The preferred C is amorphous C. The preferred Si is amorphous Si. The preferred combination of Si and O in this context is amorphous silica ($SiO_2$). The preferred combination of Si and N in this context is amorphous silicon nitride ($Si_3N_4$). The preferred combination of Ga and N in this context is amorphous gallium nitride (GaN). The preferred combinations of In, Sn, Zn and O are amorphous indium tin oxide (ITO), amorphous indium zinc oxide (IZO), amorphous zinc oxide (ZnO) and amorphous indium tin zinc oxide (ITZO).

Preferred crystalline materials are one or more selected from the group consisting of: diamond, c-BN, h-BN and crystalline oxides.

Preferred crystalline oxides in this context are one or more selected from the group consisting of: $SiO_2$, SiC, $Si_3N_4$, GaN, AlN, $Al_2O_3$, BaO and $TiO_2$.

Preferred crystalline oxides and nitrides in this context are one or more selected from the group consisting of: $SiO_2$, SiC, $Si_3N_4$, GaN, AlN, $Al_2O_3$, BaO and $TiO_2$.

Preferred polymers are one or more selected from the group consisting of: polyethylene, polystyrene, polycarbonate, polyvinyl alcohol, polymethyl methacrylate, polyimide, polyethylene terephthalate, polyethylene naphthalate, polytetrafluoroethylene, Poly(3,4-ethylenedioxythiophene) (PEDOT), polystyrene sulfonate (PSS), and PEDOT:PSS (Poly (3,4-ethylenedioxythiophene) styrene sulfonate).

A preferred polymer may be a photoresist polymer. One preferred polymer is a negative photoresist polymer. Another preferred polymer is a positive photoresist polymer.

Preferred composites are a polymer matrix comprising one or more selected from the group consisting of: nanoparticles, quantum dots, carbon nanotubes, silver nanowires and nanosheets. The preferred nanosheets are selected from the lists presented for the 2-dimensional materials.

Preferred glasses are one or more selected from the group consisting of: ultra-thin flexible glass and spin-on glass.

Preferred semiconductors are single-element semiconductors or compound semiconductors. Preferred single-element semiconductors are one or more selected from the group consisting of: Si, Ge, and Sn. Preferred compounds in this context are one or more selected from the group consisting of: GaAs, GaN, GaP, CdS, PbS, BP, $MoS_2$, $MoSe_2$, $MoTe_2$, $WS_2$, $WSe_2$, $WTe_2$, $NbS_2$, $NbSe_2$, $NbTe_2$, $TaS_2$, $TaSe_2$, $TaTe_2$, $TiSe_2$, $VSe_2$, $CrS_2$, and $CrSe_2$. Doped versions of the above semiconductors are also preferred.

The support is preferably a partial lamina. A partial lamina preferably provides one or more vacant sections, over which the cover is not attached to the support. The vacant sections define spanning sections of the cover, which are moveable. Where a substrate is present, the vacant sections give rise to cavities.

In one embodiment, the support has one or more perforations. A perforation preferably gives rise to an isolated cavity. A perforation preferably gives rise to a spanning section which is a closed area.

In one embodiment, the support has one or more channels. A channel preferably gives rise to a line cavity. A channel preferably gives rise to a spanning section which is an elongate strip.

In one embodiment, the support is a mesh or a grid or a gallery system. In one aspect of this embodiment, the support gives rise to a connected cavity network. In one aspect of this embodiment, the support gives rise to a connected network of spanning sections.

In one embodiment, the support comprises one or more voids. Preferred voids may be empty (vacuum) or filled. Preferred filling materials are one or more selected from liquids, preferably water, solutions and liquid crystals; and gases, preferably air, $N_2$, Ne and $SF_6$.

In one embodiment, it is preferred for the support to have a low fill ratio. The fill ratio is the mass of the support divided by the theoretical mass of a support of the same material having no voids. The fill ratio is preferably 70% or less, more preferably 40% or less, most preferably 35% or less. In one aspect of this embodiment, the fill ratio is 25% or less, preferably 5% or less. One aspect of this embodiment is directed to a light sail.

In one embodiment, the support has a thickness of 500 μm or less, preferably 10 μm or less, preferably 2 μm or less. In one aspect, the thickness is 1600 nm or less. In another aspect, the thickness is 800 nm or less. In one aspect, the thickness is 200 nm or less.

In one embodiment, the support is formed directly on a surface of the substrate. In another embodiment, the support is applied and formed on the cover.

In one embodiment, the support is formed on the substrate by thermal oxidation. In another embodiment, the support is deposited on the cover and then patterned. In another embodiment, the support is deposited on the cover, then patterned and then transferred to the substrate.

Substrate

In one aspect of this disclosure, the optical element comprises a substrate. A preferred substrate is attached to the support. A preferred substrate holds the support in a fixed position relative to the substrate. A preferred substrate defines a plane with respect to which altitudes are measured. Where a substrate is present, an altitude determines interference behaviour.

The substrate can be made of a number of materials and the skilled person can select a material which he considers suitable. Preferred materials are one or more selected from the following:

One or more amorphous materials;
One or more crystalline materials;
One or more polymers;
One or more composites;
One or more glasses; and
One or more semiconductors One set of preferred amorphous materials is one or more elements selected from the group consisting of: Ag, Al, Au, B, Ba, Be, Bi, C, Ca, Cr, Cs, Co, Cu, Fe, Ga, Ge, H, Hf, Hg, In, Ir, K, Mg, Mn, Mo, Na, Nb, Ni, Li, Ti, Os, P, Pb, Pd, Pt, Re, Rh, Ru, S, Sb, Sc, Se, Si, Sn, Sr, Ta, Te, V, W, Zr and Zn. Other preferred amorphous materials are one or more combinations of two or more of the preceding elements, preferably alloys, or compounds of one or more of the preceding elements with chalcogens (O, S, Se, Te), N or C. The preferred C is amorphous C. The preferred Si is amorphous Si. The preferred combination of Si and O in this context is amorphous silica ($SiO_2$). The preferred combination of Si and N in this context is amorphous silicon nitride ($Si_3N_4$). The preferred combination of Ga and N in this context is amorphous gallium nitride (GaN). The preferred combinations of In, Sn, Zn and O are amorphous indium tin oxide (ITO), amorphous indium zinc oxide (IZO), amorphous zinc oxide (ZnO) and amorphous indium tin zinc oxide (ITZO).

One more preferred set of preferred amorphous materials is one or more selected from the group consisting of: Ag, Al, Au, B, Ba, C, Ca, Cr, Cs, Co, Cu, Fe, Ga, Ge, Hf, In, K, Mg, Mn, Mo, Na, Nb, Ni, Li, Ti, P, Pb, Pd, Pt, S, Sb, Se, Si, Sn, Sr, Ta, Te, V, W, Zr and Zn. Other preferred amorphous materials are one or more combinations of two or more of the preceding elements, preferably alloys, or compounds of one or more of the preceding elements with chalcogens (O, S, Se, Te), N or C. The preferred C is amorphous C. The preferred Si is amorphous Si. The preferred combination of Si and O in this context is amorphous silica ($SiO_2$). The preferred combination of Si and N in this context is amorphous silicon nitride ($Si_3N_4$). The preferred combination of Ga and N in this context is amorphous gallium nitride (GaN). The preferred combinations of In, Sn, Zn and O are amorphous indium tin oxide (ITO), amorphous indium zinc oxide (IZO), amorphous zinc oxide (ZnO) and amorphous indium tin zinc oxide (ITZO).

Preferred crystalline materials are one or more selected from the group consisting of: diamond, c-BN, h-BN and crystalline oxides.

Preferred crystalline oxides in this context are one or more selected from the group consisting of: $SiO_2$, SiC, $Si_3N_4$, GaN, AlN, $Al_2O_3$, BaO and $TiO_2$.

Preferred crystalline materials are one or more selected from the group consisting of: diamond, c-BN, h-BN, crystalline oxides and nitrides.

Preferred crystalline oxides or nitrides in this context are one or more selected from the group consisting of: $SiO_2$, SiC, $Si_3N_4$, GaN, AlN, $Al_2O_3$, BaO and $TiO_2$.

Preferred polymers are one or more selected from the group consisting of: polyethylene, polystyrene, polycarbonate, polyvinyl alcohol, polymethyl methacrylate, polyimide, polyethylene terephthalate, polyethylene naphthalate, polytetrafluoroethylene, Poly(3,4-ethylenedioxythiophene) (PEDOT), polystyrene sulfonate (PSS), and PEDOT:PSS (Poly (3,4-ethylenedioxythiophene) styrene sulfonate).

Preferred composites are a polymer matrix comprising one or more selected from the group consisting of: nanoparticles, quantum dots, carbon nanotubes, silver nanowires and nanosheets. The preferred nanosheets are selected from the lists presented for the 2-dimensional materials.

Preferred glasses are one or more selected from the group consisting of: ultra-thin flexible glass and spin-on glass.

Preferred semiconductors are single-element semiconductors or compound semiconductors. Preferred single-element semiconductors are one or more selected from the group consisting of: Si, Ge, and Sn. Preferred compounds in this context are one or more selected from the group consisting of: GaAs, GaN, GaP, CdS, PbS, BP, $MoS_2$, $MoSe_2$, $MoTe_2$, $WS_2$, $WSe_2$, $WTe_2$, $NbS_2$, $NbSe_2$, $NbTe_2$, $TaS_2$, $TaSe_2$, $TaTe_2$, $TiSe_2$, $VSe_2$, $CrS_2$, $CrSe_2$ and. Doped versions of the above semiconductors are also preferred.

In one embodiment, the substrate and the support may be a single integral part. In one embodiment, the substrate and the support may be of the same material.

Cavities and Spanning sections

Only a part of the cover is attached to the support. A further part of the cover is not attached to the support. The part of the cover which is not attached to the support allows flexion of the cover, preferably in a direction perpendicular to a plane defined by the support. Sections of the cover which are not attached to the support constitute spanning sections. Spanning sections can be flexed. Their position and shape can be altered.

Where the optical element has a substrate, a cavity is defined by the cover, in particular a spanning section.

2-Dimensional Portion

The cover comprises a 2-dimensional portion with one or more 2-dimensional materials. The 2-dimensional material preferably provides strength to the cover. The 2-dimensional materials are preferably adapted and arranged to support one or more deposited materials, preferably support a mass at least 10 times its own mass.

2-dimensional materials are known to the skilled person and he may select a suitable 2-dimensional material for performing the invention.

A preferred 2-dimensional material is a single layer material. A preferred 2-dimensional material is crystalline. A preferred 2-dimensional material is a single layer of atoms, preferably a single layer of covalently bonded atoms. A preferred 2-dimensional material is an atomic monolayer.

Another preferred 2-dimensional material is an amorphous monolayer, preferably monolayer amorphous carbon or amorphous boron nitride.

In one embodiment, a 2-dimensional material is selected from the 2D list consisting of: C, BN, P, $MoS_2$, $MoSe_2$, $MoTe_2$, $WS_2$, $WSe_2$, $WTe_2$, $NbS_2$, $NbSe_2$, $NbTe_2$, $TaS_2$, $TaSe_2$, $TaTe_2$, $TiSe_2$, $VSe_2$, $CrS_2$, $CrSe_2$, B, Ge, Si, $Si_2BN$, Sn, Pb, P, Sb, Bi. The preferred C in this context is one or more selected from the group consisting of: graphene, one or more graphitic layers and graphyne; preferably graphene. The preferred BN in this context is h-BN. The preferred P in this context is black phosphorus or phosphorene. The preferred B in this context is borophene. The preferred Ge in this context is germanene. The preferred Si in this context is silicene. The preferred Sn in this context is stanene. The preferred Pb in this context is plumbene. The preferred Sb in this context is antimonene. The preferred Bi in this context is bismuthine.

In one embodiment, a 2-dimensional material is a transition metal chalcogenide not listed in the 2D list.

In one embodiment a 2-dimensional material is an oxide of a member of the 2D list.

In one embodiment, a 2-dimensional material is an atomic intercalated variant of a member of the 2D list.

In one embodiment, a 2-dimensional material is a physically, chemically, mechanically and/or electromagnetically functionalised derivative of a member of the 2D list. A preferred physical functionalisation is perforation or atomic barrage treatment. A preferred mechanical functionalisation is stretching or stressing. A preferred electromagnetic functionalisation is application of a voltage.

In one embodiment, a 2-dimensional material is graphene or a derivative thereof.

In one embodiment, a 2-dimensional material is boron nitride or a derivative thereof.

One preferred type of 2-dimensional material is a contiguous sheet. A contiguous sheet preferably has an area at least 10% of the area of the cover, more preferably at least 50%, more preferably at least 80%, most preferably the whole area of the cover.

In one embodiment, a contiguous sheet is prepared by deposition onto a surface.

Another preferred type of 2-dimensional material is a composite sheet. A composite sheet preferably comprises two or more, preferably 20 or more, more preferably 100 or more, sub-sheets of 2-dimensional material. The sub-sheets are preferably attached together, preferably by Van der Waals force. The preparation of a composite sheet preferably comprises cutting a 2-dimensional material. The preparation of a composite sheet preferably comprises curing. A composite sheet preferably comprises a polymer.

A preferred composite sheet is obtained by ball milling, mechanical cleavage, solvent exfoliation, sonication, or by a combination of any of them.

In one embodiment, a composite sheet is applied to a surface as a mixture of 2 or more sheets of a 2-dimensional material and one or more polymers.

In one embodiment, the 2-dimensional portion is formed directly on a surface of the support. In another embodiment, the 2-dimensional portion is formed prior to attachment to the support.

In one embodiment, the 2-dimensional portion is formed on the support by chemical vapour deposition. In another embodiment, the 2-dimensional portion is formed on a precursor by chemical vapour deposition and then transferred to the support. In another embodiment, multiple sections of 2-dimensional material are provided in a fluid. The fluid may also comprise a polymer. In one aspect of this embodiment, the fluid is applied to the support and cured to form a composite 2-dimensional material. In one aspect of this embodiment, the fluid is applied to a precursor and cured to form a composite 2-dimensional material.

Cover Constituents

The cover preferably comprises a cover constituent other than the 2-dimensional portion. Preferred cover constituents increase the reflectivity of the cover, preferably sufficiently to fall within the ranges of the first embodiment.

In one embodiment, the cover comprises amorphous material.

In another embodiment, the cover comprises metal.

In another embodiment, the cover comprises one or more additives as listed in the embodiments.

The categories of amorphous material, metal and additive are not mutually exclusive.

In one embodiment, an amorphous material is a metal.

In one embodiment, an additive material is a metal.

In one embodiment, a metal is an additive material.

In one embodiment, an amorphous containing layer is a metal containing layer.

In one embodiment, an amorphous containing layer is an additive containing layer.

In one embodiment, an additive containing layer is a metal containing layer.

The one or more further constituents of the cover are preferably present in an amount sufficient for the value of transmittance divided by reflectance to be less than 0.5.

The cover may be constituted as two or more layers. Adjacent layers preferably have different chemical composition. The cover may comprise one or more 2-dimensional containing layers. The cover may comprise one or more layers which are not 2-dimensional containing layers, preferably one or more selected from the list of: a metal containing layer, an amorphous containing layer and an additive containing layer.

In one embodiment, the layer at the first surface of the cover is a 2-dimensional containing layer. In another embodiment, the layer at the first surface of the cover is a layer which is not a 2-dimensional containing layer.

In one embodiment, the layer at the second surface of the cover is a 2-dimensional containing layer. In another embodiment, the layer at the second surface of the cover is a layer which is not a 2-dimensional containing layer.

Light Responsive Device

A further contribution to overcoming one or more of the disadvantages in the prior art is made by a light responsive device, preferably a light sail. A contribution is made by an optical element comprising:
 i. a cover having a first surface and a second surface, and
 j. a support;
 wherein:
  the cover is orientated with the first surface directed towards the support;
  a part of the first surface is attached to the support, the part preferably not being more than 70 area % of the first surface, more preferably not more than 40 area % of the first surface, most preferably not more than 35 area % of the first surface;
 A spatial arrangement of the second surface relative to the support defines a cover contour profile;
  the optical element is adapted and arranged for the second surface to move from a first cover contour profile to a further cover contour profile in response to incident radiation;
  the cover comprises a 2-dimensional portion which is one or more 2-dimensional materials;
  the cover has a value of transmittance divided by reflectance of not more than 0.5, preferably not more than 0.25, more preferably not more than 0.1, most preferably not more than 0.01, for light incident on the second surface, the reflectance and transmittance being measured at a wavelength $\lambda$; and
  $\lambda$ is in the range from 10 nm to 20 µm, preferably 10 nm to 2 µm. In one aspect, most preferably 380 nm to 740 nm. In another aspect, more preferably from 10 nm to 200 nm, most preferably from 13 nm to 193 nm. In another aspect, more preferably from 700 nm to 2000 nm, most preferably from 850 nm to 1550 nm.

In one aspect of this embodiment, $\lambda$ is 532 nm. It is preferred according to this aspect for optical measurements to be made using a frequency doubled Nd YAG laser.

In one aspect of this embodiment, $\lambda$ is 476 nm. It is preferred according to this aspect for optical measurements to be made using a blue Kr laser.

In one aspect of this embodiment, $\lambda$ is 594 nm. It is preferred according to this aspect for optical measurements to be made using a yellow He—Ne laser.

In one aspect of this embodiment, $\lambda$ is 647 nm. It is preferred according to this aspect for optical measurements to be made using a red Kr laser.

In one aspect of this embodiment, the value of transmittance divided by reflectance is 0.5 or less, preferably 0.25 or less, more preferably 0.1 or less, most preferably 0.01 for all wavelengths $\lambda$ in the range from 10 nm to 2 µm, preferably for all wavelengths in the range from 10 nm to 20 µm.

In one aspect of this embodiment, the value of transmittance divided by reflectance is 0.5 or less, preferably 0.25 or less, more preferably 0.1 or less, most preferably 0.01 for all wavelengths $\lambda$ in the range from 380 nm to 740 nm.

In one aspect of this embodiment, the value of transmittance divided by reflectance is 0.5 or less, preferably 0.25 or less, more preferably 0.1 or less, most preferably 0.01 for all wavelengths $\lambda$ in the range from 13 to 193 nm, preferably for all wavelengths in the range from 10 to 200 nm.

In one aspect of this embodiment, the value of transmittance divided by reflectance is 0.5 or less, preferably 0.25 or less, more preferably 0.1 or less, most preferably 0.01 for all wavelengths $\lambda$ in the range from 850 to 1550 nm, preferably for all wavelengths in the range from 700 to 2000 nm.

In one aspect of this embodiment, the cover and support border one or more open cavities. The one or more open cavities preferably each have an opening, the opening and the cover being on opposite sides of the cavity.

In one aspect of this embodiment, the reflectance and transmittance are for light incident on the second surface. In one aspect of this embodiment, the transmittance and reflectance values are for light incident at an angle $\theta$ from a normal to the second surface, $\theta$ being in the range from 0 to 85°. In one aspect, $\theta$ is 0°. In another aspect $\theta$ is 15°. In another aspect $\theta$ is 30°. In another aspect $\theta$ is 45°. In another aspect $\theta$ is 60°. In another aspect $\theta$ is 75°.

Process for Preparing an Optical Element

In one embodiment, a process for the preparation of an optical element comprises the following steps:
 a. Providing a support;
 b. attaching a cover to the support, wherein the cover comprises a 2-dimensional material;
 c. providing a means for altering the position of the cover in relation to the support;

The process may comprise the step of providing a substrate. A substrate is preferably provided prior to provision of the support. The support may be applied to the substrate. The support may be applied to the substrate.

The process may comprise the step of removing part of the support. Preferred routes to removing part of the support are laser drilling, physical bombardment and chemical etching.

The cover may be formed in situ or preformed for attachment to the support.

Element Arrays

The present invention can be employed in a device comprising multiple moveable cover sections, which preferably can be moved independently. In one aspect of this embodiment, a device can comprise multiple cavities. In another aspect of this embodiment, the cover can comprise multiple spanning sections. In one aspect of this embodiment, the device may comprise up to $1.4 \cdot 10^{12}$ independently moveable sections, or up to $2.5 \cdot 10^{12}$, or up to $5.5 \cdot 10^{10}$, or up to $1.64 \cdot 10^{10}$, or up to $9 \cdot 10^8$, or up to $4 \cdot 10^8$, or up to $2.3 \cdot 10^8$.

The present invention can be employed in a pixel based display device.

Casing

The optical elements and devices of the invention may comprise a casing. A preferred casing provides mechanical protection. In one embodiment, a casing provides a seal, preferably a gas seal. A casing may be used as a terminal in a means.

Test Methods

Reflectance, Transmittance and Absorbance

Reflectance, transmittance and absorbance were measured by directing a laser at the surface.

The laser was selected from the following last, depending on the wavelength tested:

For $\lambda$=532 nm: frequency doubled Nd YAG laser.
For $\lambda$=476 nm: blue Kr laser.
For $\lambda$=594 nm: yellow He—Ne laser.
For $\lambda$=647 nm: red Kr laser.

FIGURES

The invention is now further exemplified using figures. The figures are intended for clarification and do not limit the scope of the invention.

Figures List

Figure 2:
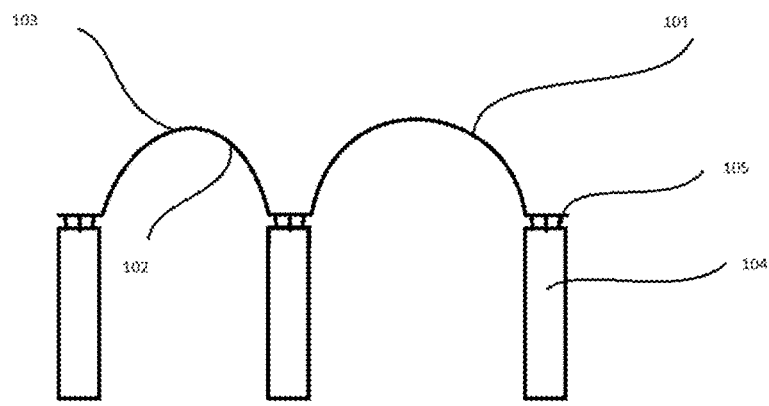
Figure 3:
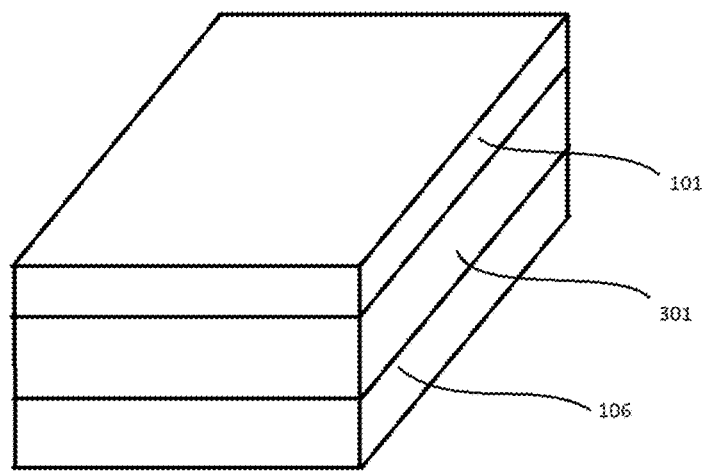
Figure 4:
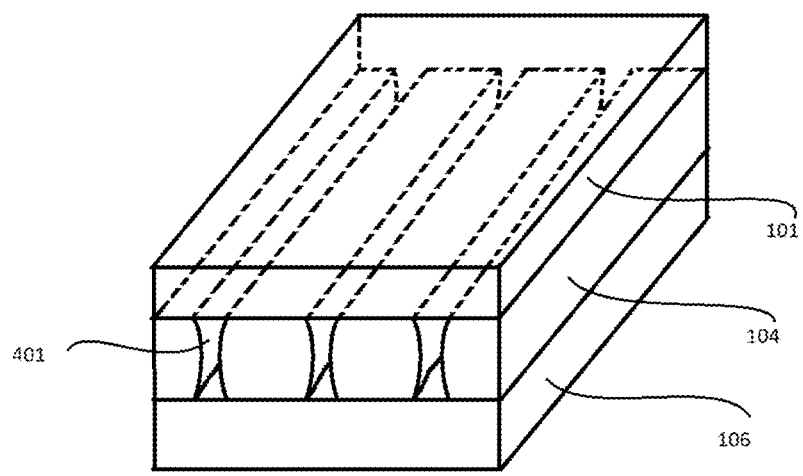
Figure 5:
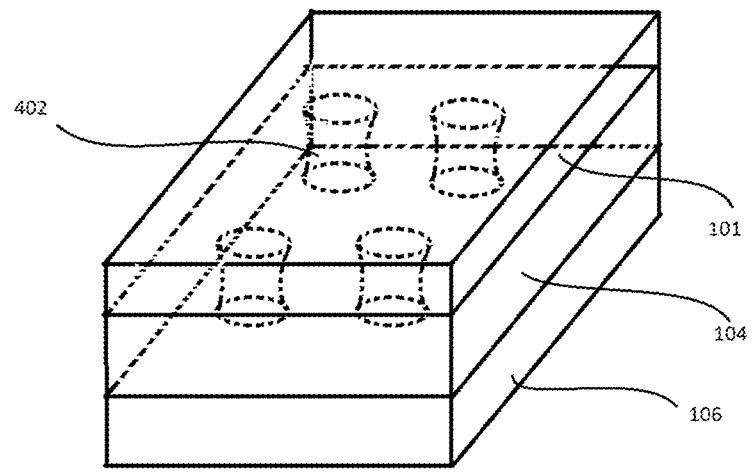
Figure 6:
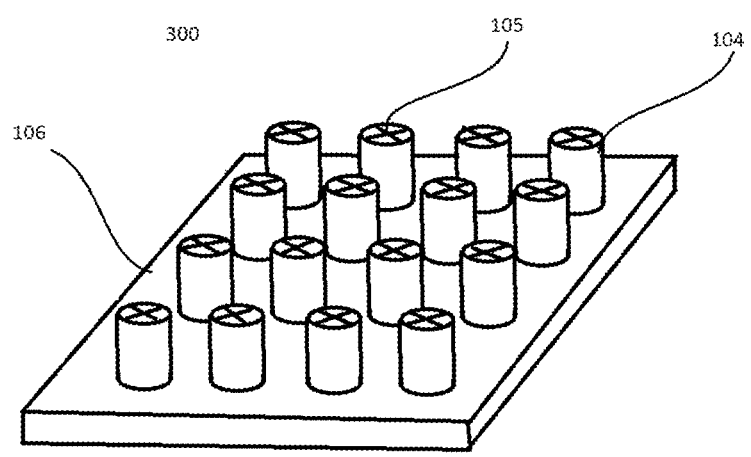
Figure 7:
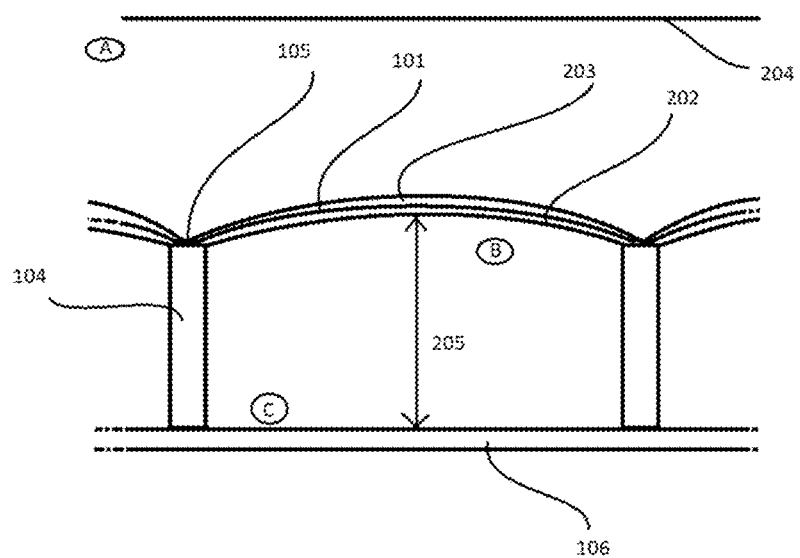
Figure 8:
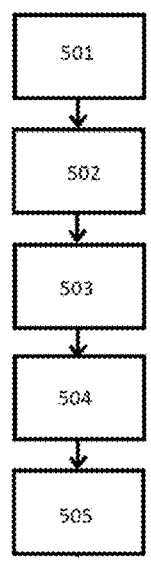
Figure 9:
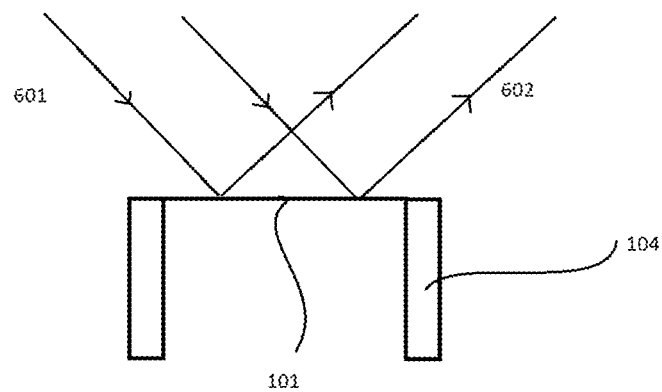
Figure 10:
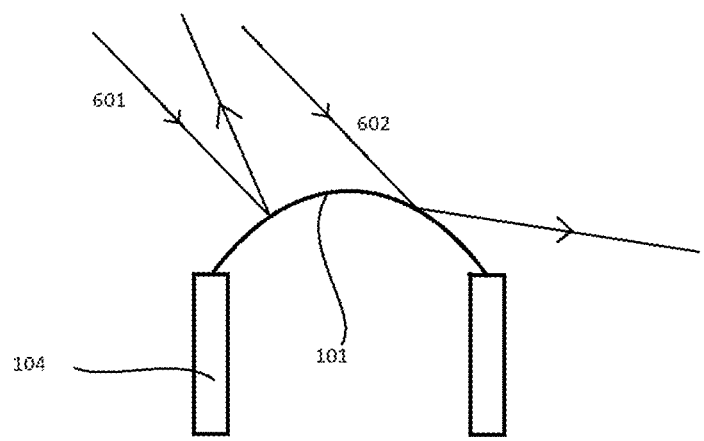
Figure 11:
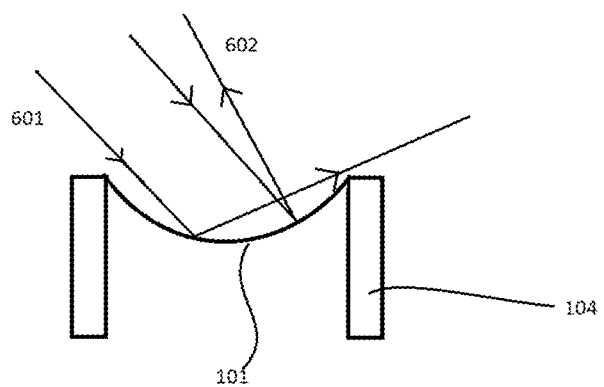
Figure 12:
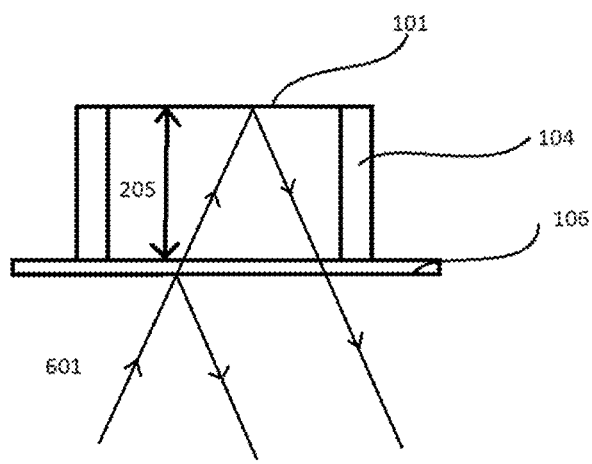
Figure 13:
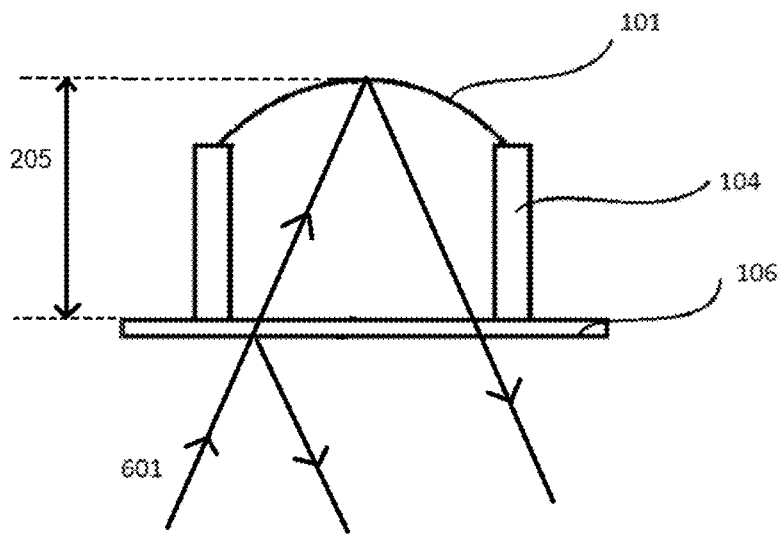
Figure 14:
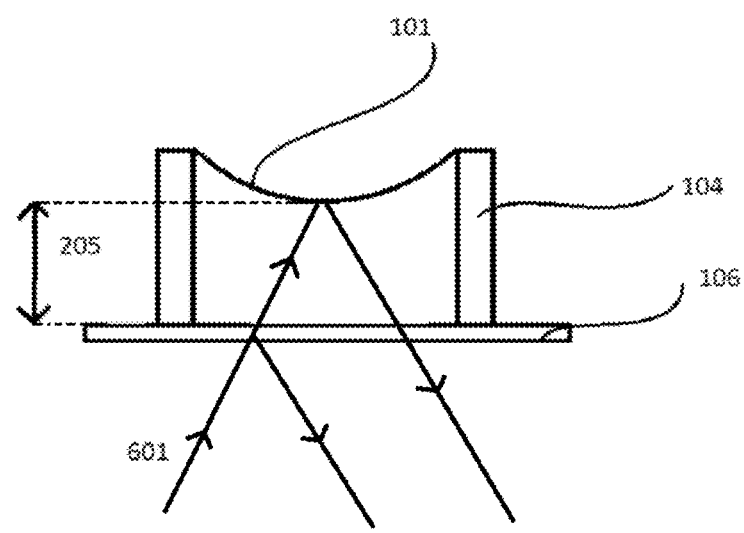
Figure 15:
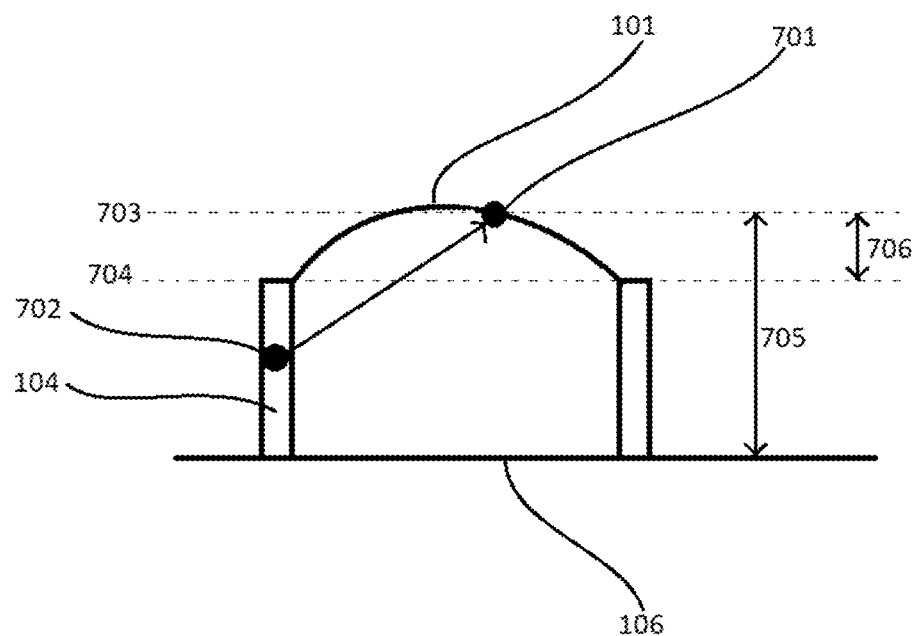
Figure 16A:
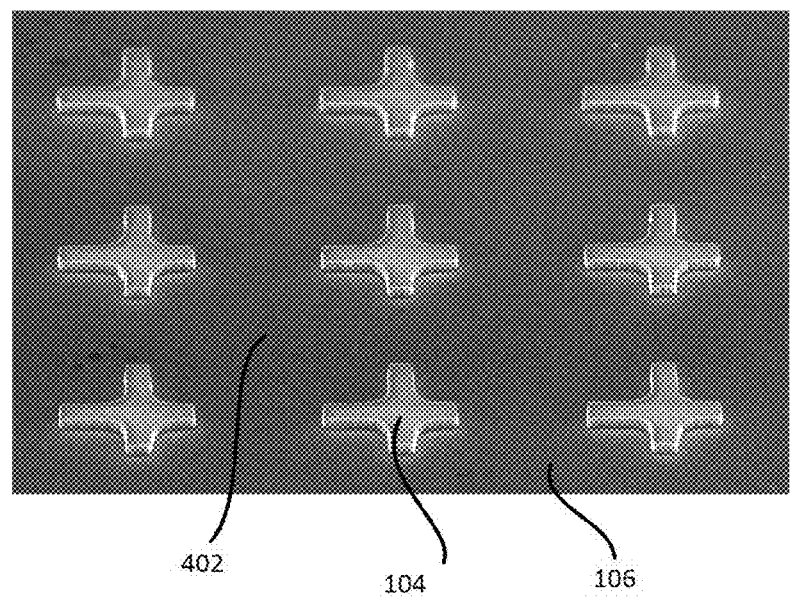
Figure 16B:
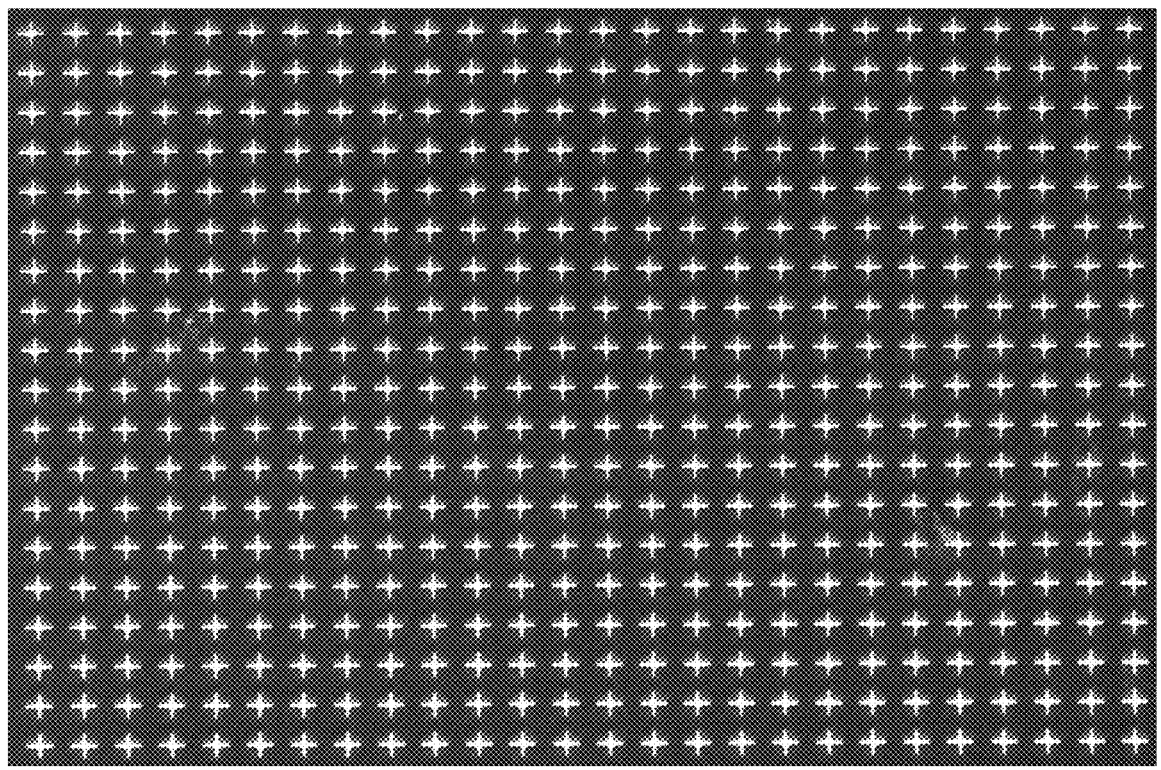
Figure 17A:
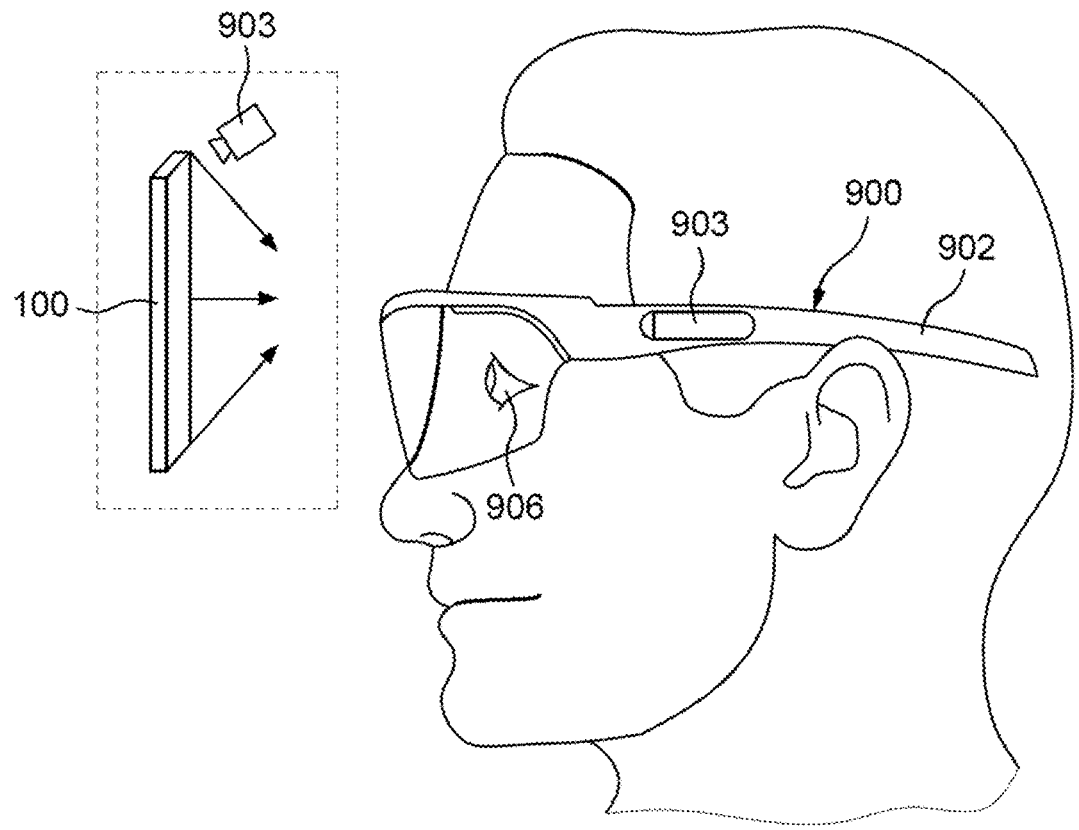
Figure 17B:
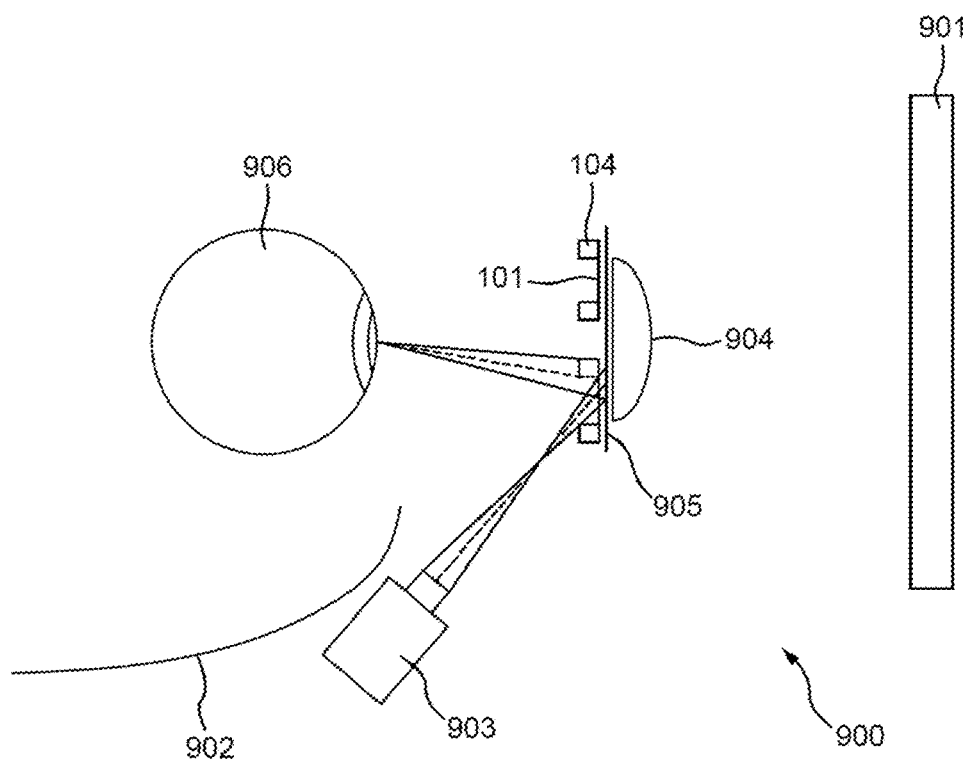
Figure 18:
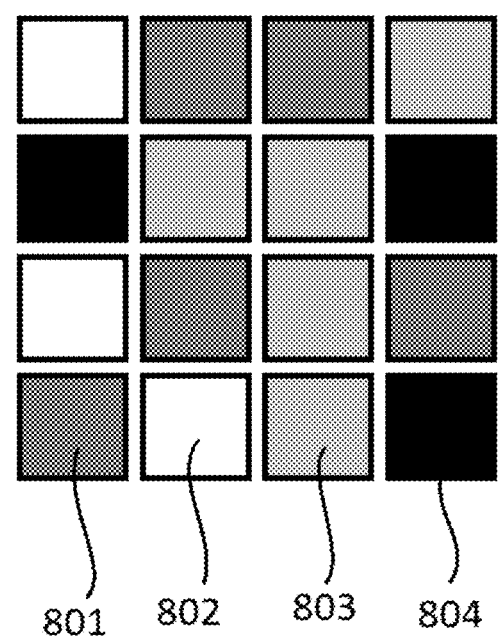

FIG. 1 shows a cross sectional view of an optical element
FIG. 2 shows a cross sectional view of an optical element
FIG. 3 shows a stack prior to removal of support material
FIG. 4 shows a device with channels
FIG. 5 shows a device with pores
FIG. 6 shows support columns on a substrate
FIG. 7 shows a cross-sectional view of an optical element
FIG. 8 shows a flow diagram for a process for preparing an optical device
FIG. 9 shows interaction of light with a flat cover
FIG. 10 shows interaction of light with a convex cover
FIG. 11 shows interaction of light with a concave cover
FIG. 12 shows interference interaction with a flat cover
FIG. 13 shows interference interaction with a convex cover
FIG. 14 shows interference interaction with a concave cover
FIG. 15 describes a position in terms of a position vector, an altitude and a depth
FIGS. 16a and 16b show an arrangement of cross-shaped supports
FIGS. 17a and 17b show a wearable display device
FIG. 18 shows a schematic of an optical device having tuneable pixels

FIGURE DESCRIPTION

FIG. 1 shows a cross sectional view of an optical element. The optical element has a cover 101 having a first surface 102 and a further surface 103. The cover 101 is attached to a support, 104, in this case 3 columns. Attachment is over a portion only of the first surface 102 and is it attachment at points 105 on the support. The portion of the cover 101 between the contact points 105 at the supports 104 is free to flex and is called a spanning section. The cover contour profile is flat.

FIG. 2 shows a cross sectional view of the same optical element as in FIG. 1. A means has been employed to flex the cover 101 at the spanning sections away from the support 104. The cover contour profile has peaks away from the support 104.

FIG. 3 shows a stack prior to removal of support material. The stack has a substrate 106 onto which has been applied a support material 301. Onto the support material 301 has been applied a cover 101.

FIG. 4 shows a device with channels. The stack of FIG. 3 has be treated to remove some of the support material 301 to leave 3 channels 401 in the support 104. The cover 101 spans each of the channels 401 to constitute spanning sections if the cover 101. The pressure of a liquid or gas in the channels 401 can be altered in order to move the flexible spanning section of the cover up or down.

FIG. 5 shows a device with pores. The stack of FIG. 3 has been treated to remove some of the support material 301 to leave 4 pores 402 in the support 104. The cover 101 spans each of the pores 402 to constitute spanning sections of the cover 101. The spanning sections of the cover 101 are flexible and the spanning section can be move up or down by a means in order to deepen or shallow the cavities constituted by the pores 402.

FIG. 6 shows support columns 104 on a substrate 106. A cover 101 can be attached to the tops 105 of the columns 104 to obtain the optical element. The cover 101, the support 104 and the substrate 106 would then border a network of cavity channels or gallery.

FIG. 7 shows a cross-sectional view of an optical element. A support 104 is attached to the upper face of the substrate 106. A cover 101 is attached to the top of the support 104. The substrate 106, support 104 and cover 101 border a cavity having a depth 205. The cover 101 is made up of a lower layer of graphene 202 and a reflective upper layer of amorphous Au 203. The cover acts as a terminal B, the substrate as a terminal C and a further terminal A is present above the cover, in the top wall of a casing 204. The cover can be moved up and down by altering the potential difference between the cover B and the substrate C or the potential difference between the cover B and the upper terminal A. In the position presented, the cover is drawn upwards by a potential difference between the cover B and the upper terminal A and the depth 205 has thereby been increased. The shape of the cover 101 relative to the support 104 constitutes a cover contour profile.

FIG. 8 shows a flow diagram for a process for preparing an optical device. In a first step 501, a support 104 is provided. In a second step 502, a graphene sheet 202 is attached to the support 104. In a third step 503, a reflective layer of amorphous Au 203 is deposited on the graphene sheet. In a further (optional) step, part of the support is removed to create spanning sections of the cover and/or cavities. In a fifth step, a means is provided for moving the cover. The process steps and their ordering may vary from those shown in FIG. 8, preferably according to the embodiments of the description.

FIG. 9 shows interaction of light with of a flat cover. The parallel rays 601 and 602 are both deflected by the same angle and remain parallel after interaction with the cover 101. This constitutes specular reflection.

FIG. 10 shows interaction of light with a convex cover. Due to the rounded convex cover contour profile, a first ray 601 is deflected by almost 180° and the second ray 602 is only deflected by a small angle. The rays 601 and 602 are no longer parallel after reflection at the cover. This constitutes diffuse reflection.

FIG. 11 shows interaction of light with a concave cover. Due to the rounded concave cover contour profile, a first ray 601 is deflected by an angle less than 90° and the second ray 602 is deflected by almost 180°. The rays 601 and 602 are no longer parallel after reflection at the cover. This constitutes diffuse reflection.

FIG. 12 shows interference interaction with a flat cover. The support 104, cover 101 and substrate 106 define a cavity having a depth 205. The substrate 106 is transmissive and absorbing to an extent and the cover 101 is reflective, such that an incoming ray 601 undergoes interference which is dependent on the depth 205.

FIG. 13 shows interference interaction with a convex cover. The cover 101 of the optical element of FIG. 12 has been deformed into a convex shape (cover contour profile). This was brought about by a means pushing the cover 101 upwards. This increases the depth 205 and the interference behaviour of incoming light 601 is altered.

FIG. 14 shows interference interaction with a concave cover. The cover 101 of the optical element of FIG. 12 has been deformed into a concave shape (cover contour profile). This was brought about by the means pushing the cover 101 downwards. This decreases the depth 205 and the interference behaviour of incoming light 601 is altered.

FIG. 15 shows an optical element in which the cover 101 adopts a cover contour profile. The position of the point 701, on the cover, can be described in terms of a position vector with a reference point 702 on the support as origin. The position of the point 701 can be described as an altitude 706. The altitude 706 is measured between a plane of the support 704 as reference and a parallel plane 703 passing through the point 701. Here, the plane of the support 704 passes through the points of attachment of the cover 101 to the support 104. The position of the point 701 can be described as a depth 705. The depth 705 is measured between the substrate surface 106 as reference and a parallel plane 703 passing through the point 701.

FIG. 16a is a perspective image showing an arrangement of cross-shaped supports 104. The cross-shaped supports are arranged on a substrate 106 in a square array. A square array of square-shaped pores 402 are defined as recesses between the supports 104. The pores 402 are linked to their adjacent neighbours so as to form a system of channels. In order to arrive at an optical element according to the invention, a cover is provided attached to the top surface of the cross-shaped supports 104. The spanning sections of the cover over the pores 402 enclose the pores 402 to constitute the cavities of the invention. The cross shape of the supports 104 allows a large active area and thus a high filling factor in a device.

FIG. 16b is a plan view of an arrangement of cross-shaped supports. The plan view shows the long-range extension of the square array of supports, pores and channels.

FIG. 17a shows a wearable device 900 comprising the optical element 100 according to the invention. A projector 903 located on a device frame 902 of the wearable device 900 projects an image onto the optical element 100. The image is directed by the optical element 100 towards a viewer 906.

FIG. 17b shows a schematic view of a wearable device 900. The device 900 has a projector 903 mounted on a device frame 902. The projector 903 projects an image towards an optical element comprising a layer 905, and a cover 101 attached to supports 104. Direction of the image towards a viewer 906 is determined by a cavity constituted between the cover 101 and the layer 905. The cavity can be tuned by movement of the cover 101. The device 900 also has a lens 904. The device allows the viewer 906 to view simultaneously the image presented by the projector 903 and a real-world image 901 which passes through the lens 904, the layer 905 and the cover 101.

FIG. 18 shows a schematic of an array of pixels. Each pixel is constituted by an adjustable cavity according to the invention. Some of the cavities are in a rest position 802, giving rise to a rest scattering/reflection/interference of light. Some of the cavities are in a first activated position 803, giving rise to a first scattering/reflection/interference of light. Some of the cavities are in a second activated position 801, giving rise to a second scattering/reflection/interference of light. Some of the cavities are in a third activated position 804, giving rise to a third scattering/reflection/interference of light. Transition between the rest position and the activated positions is effected by the means according to the invention. In one variant, the rest position and the activated positions each correspond to different potential differences produced by the means.

REFERENCE LIST 100 optical element
101 cover
102 first surface
103 second surface
104 support
105 attachment
106 substrate
202 2-dimensional material
203 deposited layer
204 casing
205 depth
301 support material
401 channel
402 pore
501 first step is provision of support
502 second step is attachment of graphene
503 third step is deposition of Au
504 fourth (optional) step is removal of part of the support
505 fifth step is provision of a means
601 first ray
602 second ray
A cover terminal
B superior terminal
C inferior terminal
701 point on cover
702 reference point on support
703 height/altitude of point
704 support plane
705 depth of cavity
706 altitude of point
801 second activated position
802 rest position
803 first activated position
804 third activated position
900 wearable device
901 real world image
902 device frame 903 projector
904 lens
905 layer
906 viewer

EXAMPLES

The invention is now further elucidated with the aid of examples. The examples are illustrative only and do not restrict the scope of the invention.

Example 1: Electrically-Controllable Diffuser for Semiconductor Manufacturing Process The device was prepared as follows: A p-doped silicon wafer with thermally-grown silicon dioxide film was provided to act as both substrate (silicon) and support (silicon dioxide film). The silicon wafer had a thickness of 500 µm and the silicon dioxide film had a thickness of 600 nm. Squared pores of 600 nm deep and 10000 nm in lateral size, separated 1000 nm from each other, were etched into the silicon dioxide film using HF and rinsing with water and drying. An AB bilayer stack of graphene was bonded to the remaining surface of the patterned silicon dioxide film via the procedure presented in Nguyen, V. L. et al, (2016), Wafer-Scale Single-Crystalline AB-Stacked Bilayer Graphene. Adv. Mater., 28: 8177-8183. A $5 \cdot 10^{-5}$ kg/m² layer of Ag was applied to the graphene layer by evaporation of Ag at a rate of 1 nm per second similar to the procedure in Gupta, R. et al (2002) (Journal of Applied Physics 92, 5264 (2002); https://doi.org/10.1063/1.1511275).

The cover above the pores was moved up and down by applying a voltage difference of 30 V between the graphene and the silicon substrate, thus building a capacitance across the silicon dioxide film and across the air medium filling the pore. In this way, most of the cover could be reversibly and repeatably moved pore-wise between a specular-reflecting surface (mirror) at the flat position and a diffuse-reflecting surface (diffuser) at the electrically-deformed position. The movement of the cover was on the order of 300 nm. The extent of movement of the cover could be controlled continuously by means of the voltage.

An ultraviolet light source ($\lambda$=400 nm) was directed at the cover surface at a 45° angle of incidence. An ultraviolet photodetector was placed to measure reflected light along the path of normal specular reflection (45°, matching the angle of incidence). When the voltage difference was 0 V, the photodetector detected a significant ultraviolet light signal; when the voltage difference was 30 V, the photodetector detected a very reduced ultraviolet light signal. The process was reversible and the device could be moved between the specular reflecting mode and the diffuser mode at a frequency of 1 kHz, measured by the same photodetector connected to an oscilloscope. The device consumed an amount of power (energy efficiency) at this operating frequency.

Next, a substrate covered with resist that is sensitive to ultraviolet light is placed facing the path of the light that reflects specularly from the device. In an arrangement where the cover surface remains flat, it will specularly reflect the light and expose the resist; on the contrary, in an arrangement where the cover surface is electrically-deformed, it will diffuse the light and will not develop the resist.

Qualitatively similar results were obtained for incident angles other than 45°.

Finally, the optical power of the source is greatly increased and the cover is exposed for long period of time without photodegrading because the graphene is protected by the transmission/reflection ratio of the metal. In addition a nanoindentation test is performed with an AFM tip by applying 100 nN to the cover and the cover does not break. The device can be moved a certain number of times between specular and diffusive reflective positions before failure because the cover is photomechanically robust (durable).

Example 2

Example 1 was repeated, but with varying density of deposited Ag. For lower densities, the cover ceased being sufficiently reflective to function as a mirror, even in a flat position, and the photomechanical durability reduced. For higher densities, the cover operational frequency was reduced at the same voltage difference. The power consumption for producing movement at 1 kHz was increased.

Results

| Example | Ag thickness [nm] | Ag density [kg/m²] | Operational frequency | Transmission/reflection (normal, at $\lambda$ = 400 nm) = x | Comments |
| --- | --- | --- | --- | --- | --- |
| 1 | 5 | $5 \cdot 10^{-5}$ | Very high | $0.01 < x < 0.1$ | Good mirror, good durability, low power consumption |
| 2a | 40 | $40 \cdot 10^{-5}$ | High | $x < 0.01$ | Very good mirror, very good durability, low power consumption |
| 2b | 3 | $3 \cdot 10^{-5}$ | Very high | $x > 0.1$ | Poor mirror, medium durability, low power consumption |
| 2c | 1 | $1 \cdot 10^{-5}$ | Very high | $x > 0.1$ | Very poor mirror, very bad durability, very low power consumption |
| 2d | 250 | $250 \cdot 10^{-5}$ | low | $x < 10^{-8}$ | Very good mirror, very good durability, medium power consumption |
| 2e | 1000 | $1000 \cdot 10^{-5}$ | Very low | $x < 10^{-30}$ | Very good mirror, very good durability, high power consumption |

Example 3: Pressure-Controllable Spatial Modulator for Telecommunications in Industry 4.0

The device was prepared as follows: An ITO-coated glass wafer (Eagle XG slim glass, available from Corning) of thickness 0.5 mm was provided to act as substrate and a spin-on glass (ACCUGLASS available from Honeywell) was applied as a 600 nm layer to act as support. Channels of 600 nm deep and 10000 nm wide were etched into the spin-on glass using HF and rinsing with water and drying. An AB bilayer stack of graphene is prepared via the procedure presented in Nguyen, V. L. et al, (2016), Wafer-Scale Single-Crystalline AB-Stacked Bilayer Graphene. Adv. Mater., 28: 8177-8183. A $5 \cdot 10^{-5}$ kg/m² layer of Mo was applied to the graphene layer by evaporation of Mo at a rate of 1 nm per second similar to the procedure in Gupta, R. et al (2002) (Journal of Applied Physics 92, 5264 (2002); https://doi.org/10.1063/1.1511275). Then, the Mo-coated graphene was bonded to the remaining surface of the patterned wafer via the procedure presented in Nguyen, V. L. et al, (2016), Wafer-Scale Single-Crystalline AB-Stacked Bilayer Graphene. Adv. Mater., 28: 8177-8183. One end of each channel was left closed to ensure that only a single entry aperture was present at which was positioned an air pump.

The cover above the channels was moved up and down by altering the air pressure in the respective channel. In this way, most of the cover could be continuously moved channel-wise between a first cover contour profile at rest that displays a first interferometric scattering for light incident on the glass substrate and a second cover contour profile at the pneumatically-deformed position that displays a second interferometric scattering for light incident on the glass substrate. A first cover contour profile has an increased reflection of light while the second cover contour profile has an increased absorption of light, thus acting as a modulator or tuneable filter. This wavelength modulation can happen in a spectrally continuous manner, where each of the different profiles existing between the first contour profile and the second contour profile display fulfil the modulation criteria for different wavelengths, thus effectively making it a multi-wavelength modulator or multi-wavelength tuneable filter.

An infrared laser source ($\lambda$=1550 nm) was directed at the glass substrate with a 45° angle of incidence. An infrared photodetector is placed facing the path of the light that reflects specularly from the device. When the pressure difference is 0 Pa, the photodetector detects a large amount of infrared light; when the pressure difference is $10^5$ Pa, the photodetector detects a very reduced amount of infrared light. The process is reversible and can modulate at a frequency of 1 kHz, measured by the same photodetector connected to an oscilloscope. The device consumes an amount of power (energy efficiency) at this operating frequency.

Next, a tungsten lamp emitting incoherent light in a continuous range of infrared wavelengths ($\lambda$ from 800 nm to 1600 nm) illuminates the device with a 45° angle of incidence. A calibrated infrared spectrometer collects the light interferometrically scattered from the device. When the pressure difference is 0 Pa, the spectrometer detects a flat spectrum except for light attenuated at 850 nm; when the pressure difference is $10^3$ Pa, the spectrometer detects a flat spectrum except for light attenuated at 1310 nm; and when the pressure difference is $10^5$ Pa, the spectrometer detects a flat spectrum except for light attenuated at 1550 nm. The process is reversible and can modulate at a frequency of 1 kHz, measured by the same spectrometer connected to an oscilloscope for a fixed wavelength. The device allows different contour profiles, including profiles with large deformation (dynamic range), that satisfy the modulation criteria for a wide range of wavelengths (data transmission bandwidth).

Finally, the optical power of the source is greatly increased and the cover is exposed for long period of time without photodegrading because the graphene is protected by the transmission/reflection ratio of the metal. In addition a nanoindentation test is performed with an AFM tip by applying 100 nN to the cover and the cover does not break. The device can be moved a certain number of times between the positions of different contour profiles before failure because the cover is photomechanically robust (durable).

Example 4

Example 3 was repeated, but with varying density of deposited Mo. For lower densities, the cover ceased being sufficiently reflective to function as a mirror, even in a flat position, thus preventing the occurrence of the interferometric scattering, and it ceased being as photomechanically robust to move as many times as before and to sustain the same pressure difference as before. For much higher densities, the cover operational frequency and the dynamic range are reduced when using the same pressure difference, and an increase of pressure difference to have the same effect causes a high-power consumption and photomechanical failure. The device allows different contour profiles, including profiles with large deformation (dynamic range), that satisfy the modulation criteria for a wide range of wavelengths (data transmission bandwidth).

Results

| Example | Mo thickness [nm] | Mo density [kg/m$^2$] | Operational frequency | Transmission/reflection (normal, at $\lambda$ = 850 nm) = x | Comments |
| --- | --- | --- | --- | --- | --- |
| 3 | 10 | $10 \cdot 10^{-5}$ | Very high | $0.1 < x < 0.25$ | Good mirror (interferometric scattering exists), large dynamic range, large data transmission bandwidth, good durability, low power consumption |
| 4a | 40 | $40 \cdot 10^{-5}$ | High | $x < 0.1$ | Very good mirror (interferometric scattering exists), medium dynamic range, medium data transmission bandwidth, very good durability, low power consumption |
| 4b | 3 | $3 \cdot 10^{-5}$ | Very high | $x > 0.25$ | Poor mirror (interferometric scattering barely exists), large but noisy dynamic range, large but noisy data transmission bandwidth, medium durability, low power consumption |

-continued

| Example | Mo thickness [nm] | Mo density [kg/m$^2$] | Operational frequency | Transmission/ reflection (normal, at $\lambda$ = 850 nm) = x | Comments |
| --- | --- | --- | --- | --- | --- |
| 4c | 1 | $1 \cdot 10^{-5}$ | Very high | x > 0.25 | Very poor mirror (interferometric scattering does not exist), no dynamic range, no data transmission bandwidth, very bad durability, very low power consumption |
| 4d | 250 | $250 \cdot 10^{-5}$ | Low | x < $10^{-6}$ | Very good mirror (interferometric scattering exists), small dynamic range, small data transmission bandwidth, very good durability, medium power consumption |
| 4e | 1000 | $1000 \cdot 10^{-5}$ | Very low | x < $10^{-23}$ | Very good mirror (interferometric scattering exists), very small dynamic range, very small data transmission bandwidth, very good durability, high power consumption |

Example 5: Passive Micromirror Component for Space Light Sails

The device was prepared as follows. A metal foil was provided to act as support. Circular holes of 10000 nm in diameter, separated 15000 nm from each other, were perforated through the metal foil using a pulsed laser as presented in Hanbach, N. (2016) (JLMN-Journal of Laser Micro/Nanoengineering Vol. 11, No. 2, 2016 http://www.jlps.gr.jp/jlmn/upload/c7127713a4e9ddcf0019534a2fd68e71.pdf). This produced a metal foil with fill ratio 31% as the support. An AB bilayer stack of graphene was bonded to the remaining surface of the patterned metal film via the procedure presented in Nguyen, V. L. et al, (2016), Wafer-Scale Single-Crystalline AB-Stacked Bilayer Graphene. Adv. Mater., 28: 8177-8183. A $30 \cdot 10^{-5}$ kg/m$^2$ layer of Ag was applied to the graphene layer by evaporation of Ag at a rate of 1 nm per second similar to the procedure in Gupta, R. et al (2002) (Journal of Applied Physics 92, 5264 (2002); https://doi.org/10.1063/1.1511275).

The cover above the holes was moved when applying a powerful light in a non-reactive environment by means of radiation pressure. At a certain incidence angle of the powerful light, the cover above the holes had a first cover contour profile; when the incidence angle was changed, the cover above the holes adapted to the new situation and self-arranged itself to a second cover contour profile. This second cover contour profile distributed the radiation pressure across the non-supported cover inhomogeneously thus causing the rotation of the device until the cover returns to the first cover contour. In this way, most of the cover could be a self-adjusting mirror.

A setup containing the device and a video-recording microscope was dropped from the upper base of a cylindrical container of 100 m in height and containing 1 Pa of air pressure. During the free fall, the device is released facing the bottom base of the tube and it remains floating in microgravity until the setup reaches the bottom base of the tube. A powerful visible laser source ($\lambda$\, =532 nm), which pointed the upper base, irradiated continuously the device with a 90° angle of incidence (perpendicular to the device) and the laser beam was continuously reflected from the device. The beam continuously generated a radiation pressure in the direction of the upper base that caused a first displacement of the device in the same direction. During the radiation pressure, the cover acquired a first contour profile that distributed the radiation pressure across the non-supported cover homogeneously as captured by the video-recording microscope.

Then, the same test is realized with the device being released forming a 45° angle with the laser beam. This time, the radiation pressure caused a second displacement of the device in the same direction. During the radiation pressure, the cover acquired a second contour profile that distributed the radiation pressure across the non-supported cover inhomogeneously. This caused that the device rotated towards recovery a 90° angle with the laser beam as captured by the video-recording microscope.

Finally, the optical power of the source is greatly increased and the cover is exposed for long period of time without photodegrading because the graphene is protected by the transmission/reflection ratio of the metal. In addition, a nanoindentation test is performed with an AFM tip by applying 100 nN to the cover and the cover does not break. The device can be moved a certain number of times between the positions of different contour profiles before failure because the cover is photomechanically robust (durable).

The device requires an amount of power (energy efficiency). The device displaces with radiation pressure because the fill ratio of the support is low (large thrust or propulsion) and the cover provides the photomechanical robustness that prevents failure of support. The device adopts different contour profiles as a function of the angle of incidence, thus causing different rotations (angle-dependent rotation).

Example 6

Example 5 was repeated, but with varying density of deposited Ag. For lower densities, the cover ceased being sufficiently reflective to function as a mirror, even in a flat position, thus preventing the occurrence of the angle-dependent rotation, and it ceased being as photomechanically robust to move as many times as before and to sustain the same radiation power as before. For much higher densities, the cover angle-dependent rotation and the propulsion are reduced when using the same radiation power, and an increase of radiation power to have the same effect causes a high-power consumption and photomechanical failure.

Results trolled continuously by means of the voltage. A first cover contour profile has an increased reflection of light while the second cover contour profile has an increased absorption of light, thus acting as a modulator or tuneable filter. This wavelength modulation can happen in a spectrally continuous manner, where each of the different profiles existing between the first contour profile and the second contour

| Example | Ag thickness [nm] | Ag density [kg/m$^2$] | Propulsion [N/kg] | Transmission/ reflection (normal, at λ = 532 nm) = x | Comments |
|---|---|---|---|---|---|
| 5 | 30 | 30 · 10$^{-5}$ | Large | x < 10$^{-3}$ | Good mirror (angle-dependent rotation exists), good durability, low power consumption |
| 6a | 60 | 60 · 10$^{-5}$ | Large | x < 10$^{-4}$ | Very good mirror (angle-dependent rotation exists), very good durability, low power consumption |
| 6b | 3 | 3 · 10$^{-5}$ | Small | x > 10$^{-3}$ | Poor mirror (angle-dependent rotation barely exists), medium durability, low power consumption |
| 6c | 1 | 1 · 10$^{-5}$ | Very small | x > 10$^{-3}$ | Very poor mirror (angle-dependent rotation does not exist), very bad durability, very low power consumption |
| 6d | 250 | 250 · 10$^{-5}$ | Very large | x < 10$^{-11}$ | Very good mirror (angle-dependent rotation exists), very good durability, medium power consumption |
| 6e | 1000 | 1000 · 10$^{-5}$ | Very large | x < 10$^{-38}$ | Very good mirror (angle-dependent rotation exists), very good durability, high power consumption |

Example 7: Electrically-Controllable Display Component for Consumer Electronics Products The device was prepared as follows: A p-doped silicon wafer with thermally-grown silicon dioxide film was provided to act as both substrate (silicon) and support (silicon dioxide film). The silicon wafer had a thickness of 500 μm and the silicon dioxide film had a thickness of 600 nm. Squared pores of 600 nm deep and 10000 nm in lateral size, separated 1000 nm from each other, and channels of 600 nm deep and 3000 nm wide aligned with the center of the squared pores, were etched into the silicon dioxide film using HF and rinsing with water and drying. Hence, the combination of squared pores and channels form a single spanning section. An AB bilayer stack of graphene was bonded to the remaining surface of the patterned silicon dioxide film via the procedure presented in Nguyen, V. L. et al, (2016), Wafer-Scale Single-Crystalline AB-Stacked Bilayer Graphene. Adv. Mater., 28: 8177-8183. A 5·10$^{-5}$ kg/m$^2$ layer of Ag was applied to the graphene layer by evaporation of Ag at a rate of 1 nm per second similar to the procedure in Gupta, R. et al (2002) (Journal of Applied Physics 92, 5264 (2002); https://doi.org/10.1063/1.1511275).

The cover above the squared pores of the spanning section was moved up and down by applying a voltage difference of 30 V between the graphene and the silicon substrate, thus building a capacitance across the silicon dioxide film and across the air medium filling the spanning section. In this way, most of the cover could be reversibly and repeatably moved pore-wise between a first cover contour profile at rest that displays a first interferometric scattering for light incident on the cover surface and a second cover contour profile at the electrically-deformed position that displays a second interferometric scattering for light incident on the cover surface. The movement of the cover was on the order of 300 nm. The extent of movement of the cover could be controlled continuously by means of the voltage. A first cover contour profile has an increased reflection of light while the second cover contour profile has an increased absorption of light, thus acting as a modulator or tuneable filter. This wavelength modulation can happen in a spectrally continuous manner, where each of the different profiles existing between the first contour profile and the second contour profile display fulfil the modulation criteria for different wavelengths, thus effectively making it a multi-wavelength modulator or multi-wavelength tuneable filter.

The combination of squared pores and channels to create a single spanning section increases the area of the cover that can move, reduces the manufacturing complexity and increases the durability.

A green laser source (λ=532 nm) was directed at the cover surface with a 45° angle of incidence. A visible photodetector is placed facing the path of the light that reflects specularly from the device. When the voltage difference was 0 V, the photodetector detected a significant visible light signal; when the voltage difference was 30 V, the photodetector detected a very reduced visible light signal. The process was reversible and can modulate at a frequency of 1 kHz, measured by the same photodetector connected to an oscilloscope. The device consumes an amount of power (energy efficiency) at this operating frequency.

Next, a tungsten lamp emitting incoherent light in a continuous range of visible wavelengths (A from 380 nm to 740 nm) illuminates the device with a 45° angle of incidence. A calibrated visible spectrometer collects the light interferometrically scattered from the device. When the voltage difference is 0 V, the spectrometer detects a flat spectrum except for light attenuated at 500 nm; when the voltage difference is 15 V, the spectrometer detects a flat spectrum except for light attenuated at 550 nm; and when the voltage difference is 30 V, the spectrometer detects a flat spectrum except for light attenuated at 600 nm. The process is reversible and can modulate at a frequency of 1 kHz, measured by the same spectrometer connected to an oscilloscope for a fixed wavelength. The device allows different contour profiles, including profiles with large deformation (dynamic range), that satisfy the modulation criteria for a wide range of wavelengths (data transmission bandwidth).

Qualitatively similar results were obtained for incident angles other than 45°.

Finally, the optical power of the source is greatly increased and the cover is exposed for long period of time without photodegrading because the graphene is protected by the transmission/reflection ratio of the metal. In addition a nanoindentation test is performed with an AFM tip by applying 100 nN to the cover and the cover does not break. The device can be moved a certain number of times between the positions of different contour profiles before failure because the cover is photomechanically robust (durable).

Example 8

Example 7 was repeated, but without etching channels. The lack of a single spanning section made the squared pores being isolated from each other. This reduced the device yield after graphene bonding procedure and reduced the area of the cover that can move (filling factor), resulting in non-functional devices. Additionally, it reduced the cover performance and an increase of the cover performance to have the same effect requires an increase in the manufacturing complexity.

Results

| Example | Pore lateral size [nm] | Channel width [nm] | Pores/channels depth [nm] | Device yield [%] | Filling factor [%] | Comments |
|---|---|---|---|---|---|---|
| 7 | 10000 | 3000 | 600 | 99.9 | 90 | Functional, good performance, low manufacturing complexity |
| 8a | 10000 | — | 600 | 95 | 83 | Functional, good performance, high manufacturing complexity |
| 8b | 50000 | — | 600 | 10 | 96 | Nonfunctional, good performance, high manufacturing complexity |
| 8c | 1000 | — | 600 | 100 | 25 | Nonfunctional, bad performance, very high manufacturing complexity |
| 8d | 10000 | — | 250 | 40 | 83 | Nonfunctional, good performance, high manufacturing complexity |

The invention claimed is:

1. An optical element comprising:
   a. a cover having a first surface and a second surface,
   b. a support, and
   c. a means for moving the second surface;
   wherein:
   the cover is orientated with the first surface directed towards the support;
   a part of the first surface is attached to the support;
   a spatial arrangement of the second surface relative to the support defines a cover contour profile;
   the means is adapted and arranged to move the second surface from a first cover contour profile to a further cover contour profile;
   the cover comprises a 2-dimensional portion which is one or more 2-dimensional materials, wherein the 2-dimensional portion has a thickness of 10 nm or less and comprises graphene or boron nitride or both;
   the cover has a value of transmittance divided by reflectance of not more than 0.5, for light incident the second surface, the reflectance and transmittance being measured at a wavelength λ; and
   λ is in the range from 10 nm to 20 μm, and
   wherein the cover comprises an amorphous portion, a metal portion, or an additive portion.

2. The optical element according to claim 1, wherein movement from the first cover contour profile to the further cover contour profile alters the orientation of the second surface with respect to the support in at least one place on the second surface.

3. The optical element according to claim 1, wherein the amorphous portion is one or more amorphous materials.

4. The optical element according to claim 1, wherein the metal portion is one or more metals.

5. The optical element according to claim 1, wherein the additive portion is one or more elements selected from the group consisting of: Ag, Al, B, C, Cr, Fe, K, Mg, Mo, Na, Ni, Ti, P, Pb, S, Si, Ta, V, W and Zn; or one or more combinations of two or more of the previous elements, or one or more combinations of one or more of the preceding elements with one or more chalcogens (O, S, Se, Te), N or C.

6. The optical element according to claim 1, wherein the 2-dimensional portion is one or more of the following:
   a. one or more selected from the group consisting of: C, BN, P, MoS2, MoSe2, MoTe2, WS2, WSe2, WTe2, GaS, GaSe, GaTe, NbS2, NbSe2, NbTe2, TaS2, TaSe2, TaTe2, TiSe2, VSe2, CrS2, CrSe2, B, Ge, Si, Si2BN, Sn, Pb, PtS2, PtSe2, PtTe2, Sb, Bi;
   b. one or more transition metal chalcogenides, each being a transition metal chalcogenide not listed in a;

c. one or more oxides, each being an oxide of a species listed in a or b;

d. one or more atomic intercalated variants, each being an atomic intercalated vari-ant of a species listed in a or b;

e. one or more chemically functionalised derivatives, each being a chemically functionalised derivative of a species listed in a or b.

7. The optical element according to claim 1, wherein said value of transmittance divided by reflectance is 0.25 or less.

8. The optical element according to claim 1, wherein the cover has a thickness of 1 mm or less.

9. The optical element according to claim 1, wherein the means produces an electrostatic force.

10. The optical element according to claim 1, wherein the means is adapted and arranged to alter a pressure in a region at the first surface.

11. The optical element according to claim 1, further comprising a substrate having a substrate surface, wherein a part of the substrate surface is attached to the support.

12. The optical element according to claim 11, wherein the substrate surface, the support and the first surface border one or more cavities, each cavity having a cavity depth being a distance in the cavity between the substrate surface and the first surface.

13. A process for the preparation of an optical element comprising the following process steps, which can be performed in any order:
   a. providing a support;
   b. attaching a cover to the support, wherein the cover comprises a 2-dimensional material; and
   c. providing a means for altering the position of the cover in relation to the support;
   wherein the cover has a value of transmittance divided by reflectance of not more than 0.5, the reflectance and transmittance being measured at a wavelength $\lambda$; and
   wherein $\lambda$ is in the range from 10 nm to 20 μm; and wherein the 2-dimensional material has a thickness of 10 nm or less and comprises graphene or boron nitride or both.

14. An optical element made using the process according to claim 13.

15. A device comprising an optical element according to claim 1.

16. An optical element comprising:
a. a cover having a first surface and a second surface,
b. a support, and
c. a means for moving the second surface;
wherein:
wherein the cover is orientated with the first surface directed towards the support;
wherein a part of the first surface is attached to the support;
wherein a spatial arrangement of the second surface relative to the support defines a cover contour profile;
wherein the means is adapted and arranged to move the second surface from a first cover contour profile to a further cover contour profile; and
wherein the cover comprises a 2-dimensional portion which is one or more 2-dimensional materials, wherein the 2-dimensional portion has a thickness of 10 nm or less and comprises:
(a) one or more selected from the group consisting of: C, BN, P, MoS2, MoSe2, MoTe2, WS2, WSe2, WTe2, GaS, GaSe, GaTe, NbS2, NbSe2, NbTe2, TaS2, TaSe2, TaTe2, TiSe2, VSe2, CrS2, CrSe2, B, Ge, Si, Si2BN, Sn, Pb, PtS2, PtSe2, PtTe2, Sb, Bi;
(b) one or more transition metal chalcogenides, each being a transition metal chalcogenide not listed in (a);
(c) one or more oxides, each being an oxide of a species listed in (a) or (b);
(d) one or more atomic intercalated variants, each being an atomic intercalated vari-ant of a species listed in (a) or (b); or
(e) one or more chemically functionalised derivatives, each being a chemically functionalised derivative of a species listed in (a) or (b);
Wherein the cover has a value of transmittance divided by reflectance of not more than 0.5, for light incident the second surface, the reflectance and transmittance being measured at a wavelength $\lambda$;
wherein $\lambda$ is in the range from 10 nm to 20 μm, and
wherein the cover comprises an amorphous portion, a metal portion, or an additive portion.

\* \* \* \* \*